US012118433B2

United States Patent
Srinivasan et al.

(10) Patent No.: US 12,118,433 B2
(45) Date of Patent: Oct. 15, 2024

(54) SPACE-SAVING COUPLER ARM ARRANGEMENT FOR SUPERCONDUCTING QUBITS

(71) Applicant: International Business Machines Corporation, Armonk, NY (US)

(72) Inventors: Srikanth Srinivasan, Mount Kisco, NY (US); George Andrew Keefe, Cortlandt Manor, NY (US); David C. Mckay, Ossining, NY (US); Xuan Wei, White Plains, NY (US); Abhinav Kandala, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 442 days.

(21) Appl. No.: 17/552,018

(22) Filed: Dec. 15, 2021

(65) Prior Publication Data

US 2023/0186134 A1 Jun. 15, 2023

(51) Int. Cl.
*G06N 10/40* (2022.01)
*H10N 60/80* (2023.01)

(52) U.S. Cl.
CPC ........... *G06N 10/40* (2022.01); *H10N 60/805* (2023.02)

(58) Field of Classification Search
CPC .............................. G06N 10/40; H10N 60/805
See application file for complete search history.

(56) References Cited

U.S. PATENT DOCUMENTS

| 9,685,935 | B2 | 6/2017 | Strand et al. |
|---|---|---|---|
| 10,068,181 | B1 | 9/2018 | Rigetti et al. |
| 10,924,095 | B1 | 2/2021 | Mckay et al. |
| 2020/0395405 | A1 | 12/2020 | Barends |
| 2021/0142215 | A1 | 5/2021 | Rigetti et al. |
| 2021/0192380 | A1 | 6/2021 | Jin et al. |
| 2021/0218367 | A1 | 7/2021 | Berkley et al. |
| 2021/0384896 | A1 | 12/2021 | Mckay et al. |

FOREIGN PATENT DOCUMENTS

WO 2017007446 A1 1/2017

OTHER PUBLICATIONS

International Search Report and Written Opinion received for PCT Application Serial No. PCT/EP2022/085633 dated Apr. 13, 2023, 14 pages.

(Continued)

*Primary Examiner* — Matthew L Reames
(74) *Attorney, Agent, or Firm* — Amin, Turocy & Watson, LLP

(57) ABSTRACT

Systems and techniques that facilitate space-saving coupler arm arrangement for superconducting qubits are provided. In various embodiments, a device can comprise a superconducting qubit. In various aspects, the superconducting qubit can be capacitively coupled to two or more coupler arms. In various instances, a parasitic capacitance between the two or more coupler arms can be within an order of magnitude of a capacitance between the superconducting qubit and at least one of the two or more coupler arms. In various cases, the parasitic capacitance can arise due to a physical proximity between the two or more coupler arms.

20 Claims, 15 Drawing Sheets

(56) References Cited

OTHER PUBLICATIONS

Mi et al., "Short Paper: Device-and Locality-Specific Fingerprinting of Shared NISQ Quantum Computers", Proceedings of The 17th Acm Workshop on Mobility In The Evolving Internet Architecture, Oct. 18, 2021, 5 pages.

Zajac et al., "Spectator Errors in Tunable Coupling Architectures", IBM Quantum, Aug. 25, 2021, 5 pages.

Kounalakis Marios, "Nonlinear Couplings for Quantum Control of Superconducting Qubits and Electrical/Mechanical Resonators", Dec. 19, 2019, 164 pages.

Mundada et al., "Suppression of Qubit Crosstalk in a Tunable Coupling Superconducting Circuit", Physical Review Applied, vol. 12, No. 5, May 31, 2019, 11 pages.

Corcoles, A.D. et al. | "Demonstration of a quantum error detection code using a square lattice of four superconducting qubits". Nature Communications, 6:6979 (2015), DOI: 10.1038/ncomms7979, 10 pages.

Yan, F. et al. | "Tunable Coupling Scheme for Implementing High-Fidelity Two-Qubit Gates." Physical Review Applied, vol. 10, No. 5, Nov. 2018, 10 pages.

Kandala, A. et al. | "Demonstration of a High-Fidelity CNOT for Fixed-Frequency Transmons with Engineered ZZ Suppression". arXiv:2011.07050v1 [quant-ph] Nov. 13, 2020, 10 pages.

Stehlik, J. et al. | "Tunable Coupling Architecture for Fixed-frequency Transmons". arXiv:2101.07746v1 [quant-ph] Jan. 19, 2021, 7 pages.

Marques, J. F. et al. | "Logical-qubit operations in an error-detecting surface code". arXiv:2102.13071v1 [quant-ph] Feb. 25, 2021, 16 pages.

Gambetta, J. M. et al. | "Building logical qubits in a superconducting quantum computing system". arXiv:1510.04375v1 [quant-ph] Oct. 15, 2015, 10 pages.

Mell et al., "The NIST Definition of Cloud Computing," Recommendations of the National Institute of Standards and Technology, NIST Special Publication 800-145, Sep. 2011, 7 pages.

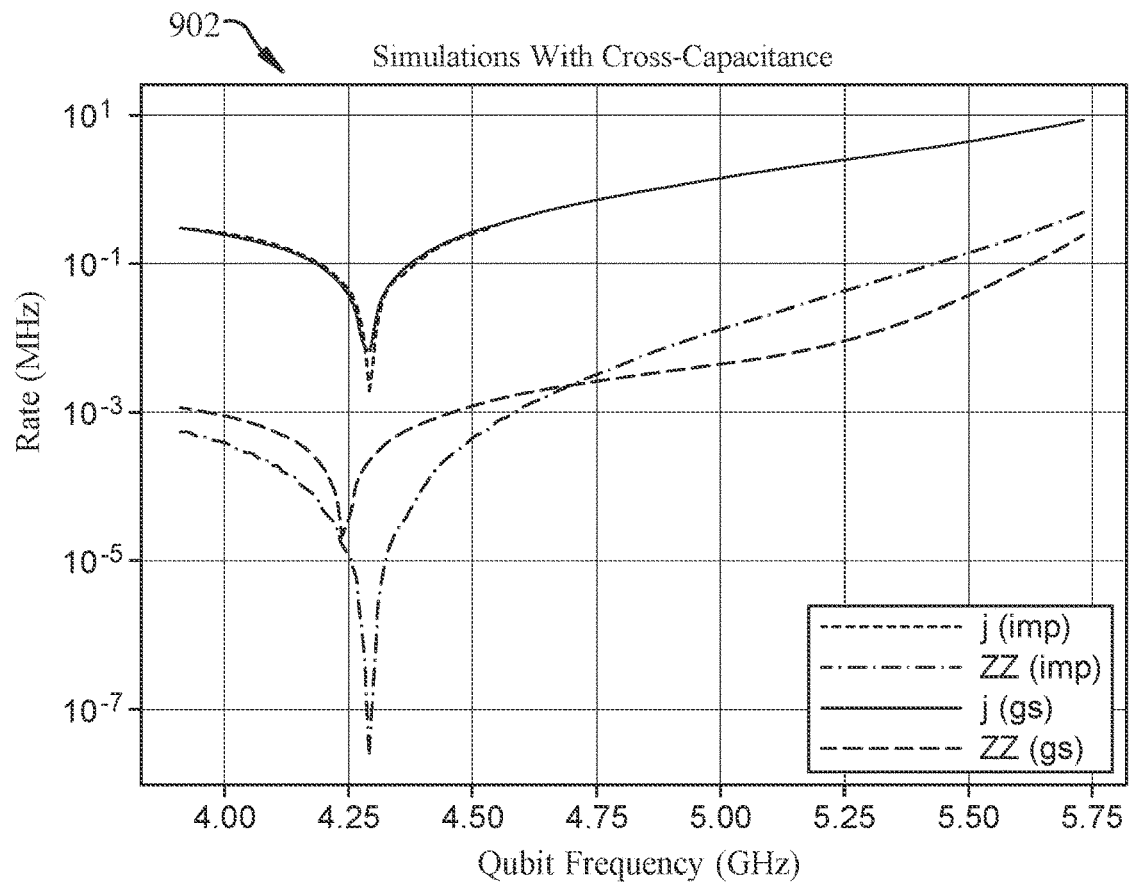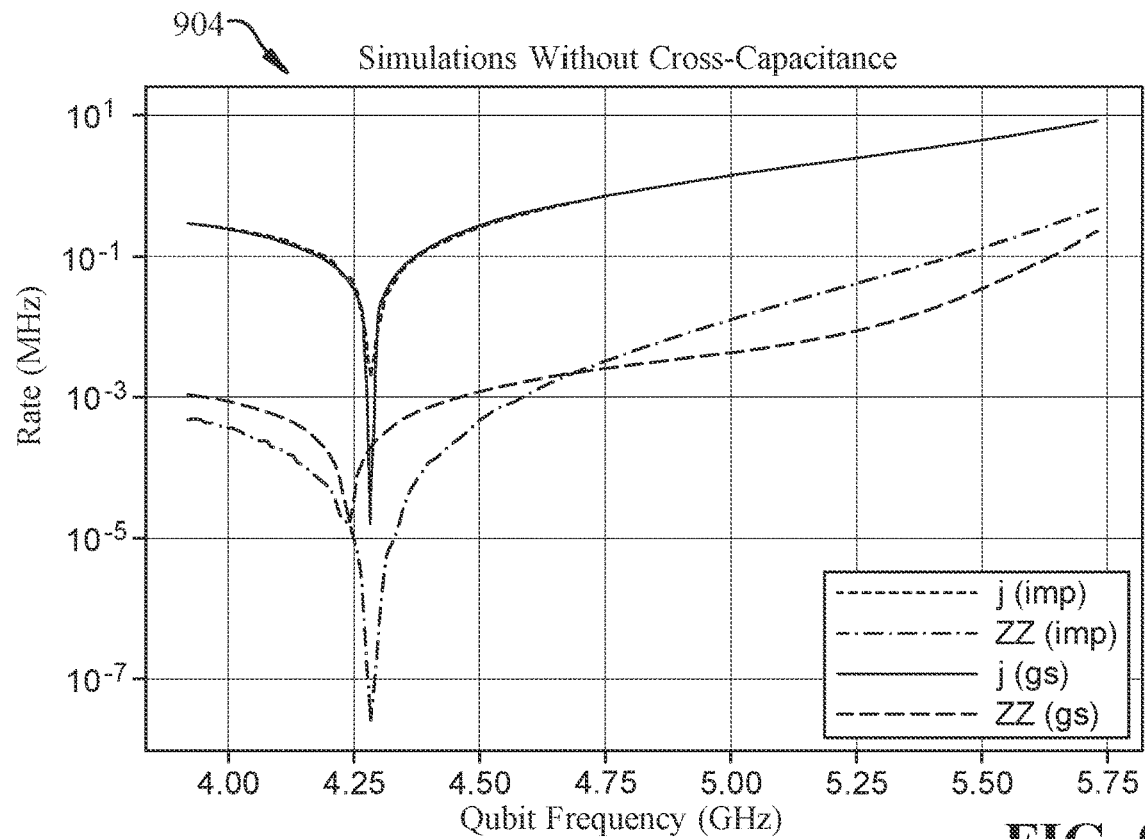
FIG. 9

SPACE-SAVING COUPLER ARM ARRANGEMENT FOR SUPERCONDUCTING QUBITS

BACKGROUND

The subject disclosure relates to qubits, and more specifically to space-saving coupler arm arrangement for superconducting qubits.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus, and/or computer program products that can facilitate space-saving coupler arm arrangement for superconducting qubits are described.

According to one or more embodiments, a device is provided. The device can comprise a superconducting qubit. In various aspects, the superconducting qubit can be capacitively coupled to two or more coupler arms. In various instances, a parasitic capacitance between the two or more coupler arms can be within an order of magnitude of a capacitance between the superconducting qubit and at least one of the two or more coupler arms. In various cases, the parasitic capacitance can arise due to a physical proximity between the two or more coupler arms. In various aspects, the two or more coupler arms can belong to a multi-order filter that couples the qubit to another qubit.

According to one or more embodiments, an apparatus is provided. The apparatus can comprise a transmon qubit. In various aspects, the transmon qubit can include a Josephson junction shunted by a planar capacitor. In various instances, the apparatus can further comprise two or more coupler arms that are capacitively coupled to a pad of the planar capacitor. In various cases, the two or more coupler arms can be in physical proximity to each other such that a cross-capacitance between the two or more coupler arms is within an order of magnitude of a direct capacitance between the pad and at least one of the two or more coupler arms. In various aspects, the two or more coupler arms can belong to a multi-order filter that couples the transmon qubit to another transmon qubit.

According to one or more embodiments, the above-described device and/or apparatus can be implemented as methods.

DESCRIPTION OF THE DRAWINGS

FIG. 9 illustrates example, non-limiting experimental and/or simulation results that demonstrate the efficacy of space-saving coupler arm arrangement for superconducting qubits in accordance with one or more embodiments described herein.

DETAILED DESCRIPTION

Figure 1:
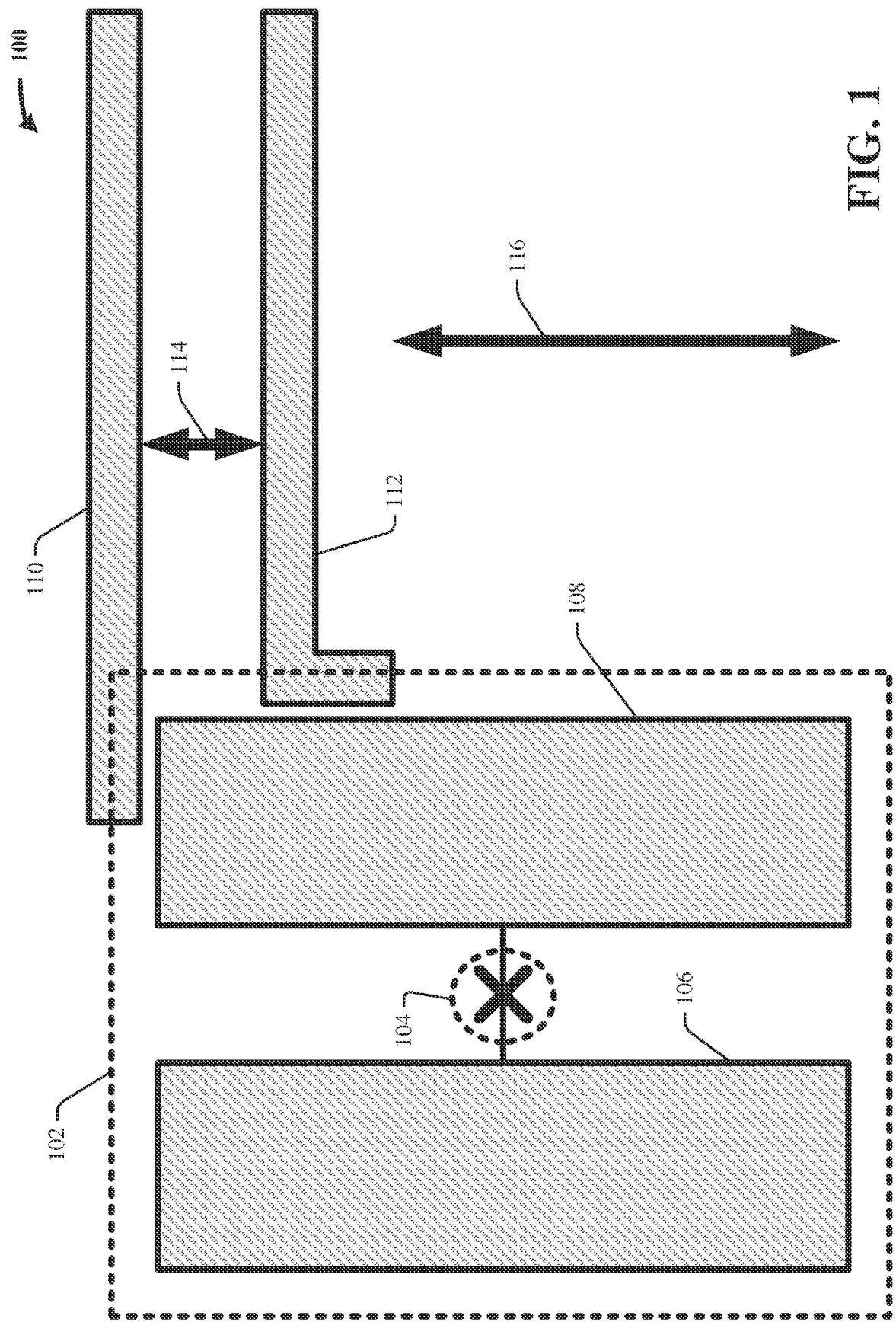
FIG. 1 illustrates a block diagram of an example, non-limiting system that facilitates space-saving coupler arm arrangement for superconducting qubits in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

A quantum computer can include two or more superconducting qubits (e.g., flux qubits, charge qubits, phase qubits, transmon qubits, SQUID loops) that are arranged in a grid/lattice on a quantum substrate (e.g., silicon wafer) and that are coupled/connected together by various couplers (e.g., direct capacitive couplers, $\lambda/2$ resonator couplers, $\lambda/4$ resonator couplers, cancellation couplers, fast-flux qubit couplers). To reduce unwanted interactions between adjacent superconducting qubits, multi-order couplers (also known as multi-order filters) have been developed. As those having ordinary skill in the art will appreciate, a multi-order filter can be any suitable superconducting architecture and/or structure that can couple a pair of superconducting qubits together via two or more electrically conductive paths. Accordingly, a multi-order filter can be considered as comprising two or more coupler arms (e.g., one coupler arm per electrically conductive path). A non-limiting example of such a multi-order filter can be a ZZ cancellation coupler, which can be made up of a direct capacitive coupling path and a λ/4 resonator coupling path.

When existing techniques are implemented, the two or more coupler arms of a multi-order filter are physically separated and/or physically spaced apart as much as possible, so as to minimize cross-capacitive interactions between the two or more coupler arms. After all, existing techniques teach that cross-capacitive interactions between the two or more coupler arms must be avoided and/or minimized at all costs. Unfortunately, this maximization of spatial separation between the coupler arms can be problematic. Specifically, each coupler arm of a multi-order filter can interface (e.g., capacitively interact) with each superconducting qubit to which the multi-order filter is coupled. However, a superconducting qubit has a finite amount of surface area and/or perimeter that is available for such interfacing. Thus, by maximizing the physical distance separating the coupler arms, much of the surface area and/or perimeter of the superconducting qubit is left unused by the multi-order filter, and such unused surface area and/or perimeter is not useable for interfacing by other multi-order filters (e.g., staggering and/or interleaving the coupler arms of two or more multi-order filters violates the separation-distance maximization principle of existing techniques and can be impractical in terms of fabrication). In other words, existing techniques, which maximize spatial separation between the coupler arms of a multi-order filter, waste significant amounts of on-chip space and make it very difficult to couple a superconducting qubit to more than one other superconducting qubit.

Thus, systems and/or techniques that address one or more of these technical problems can be desirable.

Various embodiments of the invention can address one or more of these technical problems. Specifically, various embodiments of the invention can provide systems and/or techniques that can facilitate space-saving coupler arm arrangement for superconducting qubits. In particular, the present inventors recognized that, contrary to existing techniques, cross-capacitive interactions between the coupler arms of a multi-order filter can be not problematic. More specifically, the present inventors realized that, when the coupler arms of a multi-order filter are directly capacitively interacting with a superconducting qubit, cross-capacitive interactions between the coupler arms can be easily compensated and/or accounted for by tuning and/or modifying (e.g., during fabrication) the direct capacitive interactions between the superconducting qubit and the coupler arms. Indeed, in some cases, increasing at least one magnitude of the direct capacitive interactions between the superconducting qubit and the coupler arms can compensate and/or account for the cross-capacitive interactions between the coupler arms. Thus, the present inventors devised various embodiments of the invention, in which coupler arms of a multi-order filter that are capacitively interacting with a superconducting qubit are physically spaced close together (e.g., physically separated by a small distance), as opposed to being physically spaced far apart (e.g., physically separated by a large distance). Physically spacing the coupler arms close together can cause the multi-order filter to use a small portion of the surface area and/or perimeter of the superconducting qubit that is available for interfacing, which can allow multiple other multi-order filters to interface with the superconducting qubit (e.g., which can make it easier to couple the superconducting qubit to other superconducting qubits). Furthermore, any cross-capacitive interactions that result from physically spacing the coupler arms close together can be easily compensated for during fabrication of the coupler arms.

In particular, various embodiments described herein can include a superconducting qubit. In various aspects, the superconducting qubit can be coupled to another superconducting qubit via a multi-order filter. For ease of explanation, suppose that the multi-order filter includes two electrically conductive paths between the superconducting qubit and the another superconducting qubit. Accordingly, the multi-order filter can include a first coupler arm corresponding to the first electrically conductive path and a second coupler arm corresponding to the second electrically conductive path. In various instances, the first coupler arm can capacitively interface and/or capacitively interact with the superconducting qubit, thereby yielding a first direct capacitance between the first coupler arm and the superconducting qubit. Similarly, the second coupler arm can capacitively interface and/or capacitively interact with the superconducting qubit, thereby yielding a second direct capacitance between the second coupler arm and the superconducting qubit.

In various cases, the first coupler arm and the second coupler arm can be physically located in spatial proximity to each other, such that the first coupler arm and the second coupler arm experience a cross-capacitive interaction with each other. That is, there can be a parasitic capacitance between the first coupler arm and the second coupler arm. In various aspects, the magnitude of the parasitic capacitance can increase as the physical distance between the first coupler arm and the second coupler arm decreases, and the magnitude of the parasitic capacitance can decrease as the physical distance between the first coupler arm and the second coupler arm increases.

Note that, if existing techniques were implemented, the first coupler arm and the second coupler arm would be placed as far apart as possible while still being able to capacitively interact with the superconducting qubit, thereby minimizing and/or eliminating the parasitic capacitance (e.g., in such situations, even if the parasitic capacitance is not zero, it can be considered as negligible compared to (more than one order of magnitude smaller than) the first direct capacitance and/or to the second direct capacitance). However, this would waste a significant amount of space (e.g., would significantly reduce the number of multi-order filters that can be coupled to the superconducting qubit). For ease of explanation, let $D_{existing}$ represent the physical separation distance utilized by such existing techniques.

In contrast to existing techniques, when various embodiments described herein are implemented, the first coupler arm and the second coupler arm can be physically separated by a distance that is less than $D_{existing}$ which can cause the parasitic capacitance to not be minimized. Indeed, since the parasitic capacitance can increase as the physical distance between the first coupler arm and the second coupler arm decreases, there exist one or more physical separation distances which can cause the parasitic capacitance to be less than the lesser of the first direct capacitance and the second direct capacitance but still within an order of magnitude of the lesser of the first direct capacitance and the second direct (e.g., the parasitic capacitance can be greater than or equal to one-tenth of the lesser of the first direct capacitance and the second direct). In such situations, the parasitic capacitance can be considered as non-negligible compared to the first direct capacitance and/or the second direct capacitance. For ease of explanation, let $D_{invention}$ represent a physical separation distance which causes the parasitic capacitance to be less than but still within an order of magnitude of the lesser of the first direct capacitance and the second direct capacitance.

Note that $D_{invention}$ can be significantly smaller than $D_{existing}$. Accordingly, when $D_{invention}$ separates the first coupler arm from the second coupler arm, the multi-order filter can be considered as taking up significantly less space. That is, the first coupler arm and the second coupler arm can be considered as blocking significantly less surface area and/or perimeter of the superconducting qubit. Accordingly, when $D_{invention}$ is implemented, much of the surface area and/or perimeter of the superconducting qubit can be still available for interfacing/coupling with multiple other multi-order filters. In stark contrast, when $D_{existing}$ separates the first coupler arm from the second coupler arm, the multi-order filter can be considered as taking up significantly more space. That is, the first coupler arm and the second coupler arm can be considered as blocking significantly more surface area and/or perimeter of the superconducting qubit. Accordingly, when $D_{existing}$ is implemented, much less of the surface area and/or perimeter of the superconducting qubit can be available for interfacing/coupling with multiple other multi-order filters. In other words, more multi-order filters can be coupled to the superconducting qubit when $D_{invention}$ is implemented, and fewer multi-order filters can be coupled to the superconducting qubit when $D_{existing}$ is implemented.

Although implementing $D_{invention}$ can cause a non-negligible parasitic capacitance between the first coupler arm and the second coupler arm, the present inventors realized that this is actually not a problem. Indeed, the present inventors discovered that such non-negligible parasitic capacitance can be easily compensated and/or accounted for by appropriately tuning (e.g., during fabrication of the first coupler arm and/or the second coupler arm) at least one of the first direct capacitance and/or the second direct capacitance. In particular, the present inventors experimentally verified that, when $D_{invention}$ is implemented, appropriately increasing the lesser of the first direct capacitance and the second direct capacitance (e.g., as compared to what such lesser direct capacitance would have been if $D_{existing}$ were implemented) can cause the superconducting qubit to behave (e.g., in terms of J-interaction, ZZ-interaction, and/or any other suitable qubit-to-qubit interaction as desired) as if $D_{existing}$ were implemented. As those having ordinary skill in the art will appreciate, J can represent the exchange interaction strength between a pair of qubits, and ZZ can represent the longitudinal conditional interaction strength between a pair of qubits (e.g., in the context of a cross-resonance gate, it can be desired to maximize J and minimize ZZ). In any case, when various embodiments described herein are implemented, on-chip space can be saved without negatively affecting the performance and/or behavior of the superconducting qubit.

More specifically, controlling the size, shape, dimensions, location, and/or materials of the first coupler arm can commensurately control the first direct capacitance. Similarly, controlling the size, shape, dimensions, location, and/or materials of the second coupler arm can commensurately control the second direct capacitance.

Consider a first scenario in which $D_{existing}$ is implemented. In such first scenario, the first coupler arm can be controllably fabricated such that the first direct capacitance has a first given value, and the second coupler arm can be controllably fabricated such that the second direct capacitance has a second given value. For ease of explanation, let the first given value be referred to as $C_{existing\_1}$, and let the second given value be referred to as $C_{existing\_2}$. Without loss of generality, let $C_{existing\_2} < C_{existing\_1}$.

Now, consider a second scenario in which $D_{invention}$ is instead implemented. In such second scenario, there can be a parasitic capacitance between the first coupler arm and the second coupler arm, the lesser of the first direct capacitance and the second direct capacitance can be appropriately increased so as to compensate for such parasitic capacitance, and such parasitic capacitance can be less than the increased version of the lesser of the first direct capacitance and the second direct capacitance and yet still within an order of magnitude of the increased version of such lesser direct capacitance. For ease of explanation, let the parasitic capacitance be referred to as $C_{parasitic}$, and let $C_{existing\_2\_increased} > C_{existing\_2}$ represent the increased and/or adjusted value of the second direct capacitance (e.g., the second direct capacitance in this non-limiting example is the lesser of the first direct capacitance and the second direct capacitance).

In other words, in this second scenario, the first coupler arm can be fabricated so that the first direct capacitance has a value of $C_{existing\_1}$ (e.g., the first direct capacitance is the same in both the first scenario and the second scenario), the second coupler arm can be fabricated so that the second direct capacitance has a value of $C_{existing\_2\_increased}$ (e.g., the second direct capacitance is greater in the second scenario than in the first scenario), and the first coupler arm and the second coupler arm can be separated by a distance of $D_{invention}$ (e.g., the separation distance is lesser in the second scenario than in the first scenario). This can yield a parasitic capacitance $C_{parasitic}$, such that $0.1 * C_{existing\_2\_increased} \leq C_{parasitic} \leq C_{existing\_2\_increased}$. In this second scenario, the superconducting qubit can exhibit substantially equivalent quantum electrical behavior (e.g., substantially equivalent J-interaction and/or substantially equivalent ZZ-interaction) as compared to the first scenario, notwithstanding that the second scenario utilizes a smaller separation distance (e.g., $D_{invention}$) than the first scenario (e.g., $D_{existing}$). In various cases, such equivalent quantum electrical behavior has been experimentally verified by the present inventors.

Accordingly, the behavior of the superconducting qubit can be the same in both the second scenario and the first scenario, but the first and second coupler arms in the first scenario can block a lot of surface area and/or perimeter of the superconducting qubit, whereas the first and second coupler arms in the second scenario can block significantly less surface area and/or perimeter of the superconducting qubit. In other words, the second scenario (e.g., achieved via implementation of various embodiments of the invention) can save significant amounts of on-chip space without adversely affecting the behavior of the superconducting qubit.

Moreover, a further benefit of various embodiments described herein can be a significant reduction in the chance of next-nearest-neighbor crosstalk. Suppose that a first superconducting qubit is coupled to a second superconducting qubit via a first multi-order filter, and suppose that the first superconducting qubit is also coupled to a third superconducting qubit via a second multi-order filter. If the first multi-order filter and the second multi-order filter both implement $D_{existing}$, then the coupler arms of the first multi-order filter can be physically far apart from each other, and the coupler arms of the second multi-order filter can be physically far apart from each other. However, in such case, the coupler arms of the first multi-order filter can, due to limited space/perimeter around the first superconducting qubit, be physically near to the coupler arms of the second multi-order filter, which can give rise to crosstalk between the first multi-order filter and the second multi-order filter. This can be undesirable. In stark contrast, if the first multi-order filter and the second multi-order filter both implement $D_{invention}$, then the coupler arms of the first multi-order filter can be physically close together, and the coupler arms of the second multi-order filter can be physically close together. Furthermore, in such case, the coupler arms of the first multi-order filter can be physically far apart from the coupler arms of the second multi-order filter, which can prevent and/or minimize cross-talk between the first multi-order filter and the second multi-order filter.

As those having ordinary skill in the art will appreciate, the exact value of $C_{existing\_2\_increased}$ can vary based on operational context. More specifically, the value of $C_{existing\_2\_increased}$ can depend upon the size, shape, material, and/or dimensions of the second coupler arm; upon the sizes, shapes, materials, and/or dimensions of any other coupler arms of the multi-order filter (e.g., can depend upon $C_{existing\_1}$); can depend upon the value of $C_{parasitic}$; and/or can depend upon the desired quantum electrical behavior (e.g., desired J-interaction profile, desired ZZ-interaction profile) of the superconducting qubit. Thus, there is no single formula that can deterministically and universally compute $C_{existing\_2\_increased}$ in all operational contexts. Instead, as those having ordinary skill in the art will appreciate, standard computer simulation and/or standard experimentation can be implemented to determine an appropriate value of $C_{existing\_2\_increased}$ for any given and/or desired operational context.

For example, when given a known/desired quantum electrical behavior of the superconducting qubit, a known/desired value of $C_{existing\_1}$, and a known/desired value of $C_{parasitic}$, then iterative computer simulations and/or experiments can be conducted in which a range of potential values of $C_{existing\_2\_increased}$ are swept (e.g., starting from $C_{existing\_2}$ and incrementally increasing from there) and, for each such potential value, the quantum electrical behavior of the superconducting qubit can be measured and/or tested (e.g., via a Ramsey experiment). In this way, a particular value of $C_{existing\_2\_increased}$ can be found that causes the measured quantum electrical behavior of the superconducting qubit to be the same as (e.g., within any suitable threshold margin of) the known/desired quantum electrical behavior. Those having ordinary skill in the art will appreciate that this is not in any way undue experimentation.

Furthermore, although the above discussion describes a multi-order filter having two coupler arms (e.g., two electrically conductive paths), this is a mere non-limiting example for ease of explanation. Those having ordinary skill in the art will appreciate that the herein teachings can be applied and/or extrapolated to any suitable multi-order filter that has two or more coupler arms. In other words, no matter how many coupler arms the multi-order filter has, such coupler arms can be spaced close enough together (e.g., as opposed to far apart), such that they have non-negligible cross-capacitive interactions with each other, and such non-negligible cross-capacitive interactions can be compensated and/or accounted for by increasing one or more of the direct capacitive interactions between one or more of such coupler arms and the superconducting qubit.

In any case, various embodiments of the invention can cause a multi-order filter to block less surface area and/or perimeter of a superconducting qubit as compared to existing techniques, without negatively influencing the performance and/or behavior of the superconducting qubit.

Various embodiments of the invention can be employed to use hardware and/or software to solve problems that are highly technical in nature (e.g., to facilitate space-saving coupler arm arrangement for superconducting qubits), that are not abstract, that are not mere laws of nature, that are not mere natural phenomena, and that cannot be performed as a set of mental acts by a human. Instead, various embodiments described herein include tangible quantum computing structures/architectures and/or methodologies pertaining to such tangible quantum computing structures/architectures that can be implemented so as to reduce, mitigate, and/or ameliorate the technical problem of excessive on-chip space-consumption caused by multi-order filters. Indeed, as mentioned above, when existing techniques are implemented, the coupler arms of a multi-order filter are physically spaced as far apart as possible, so as to minimize cross-capacitive interactions between the coupler arms. This is because existing techniques teach that such cross-capacitive interactions must be avoided at all costs. However, a significant problem caused by physically spacing the coupler arms far apart is excessive consumption of on-chip space. In other words, when a multi-order filter has coupler arms that are spaced far apart, the multi-order filter blocks much of the surface area and/or perimeter of the superconducting qubit that is available for interfacing/coupling. Thus, when existing techniques are implemented, very few multi-order filters are physically able to interface with the superconducting qubit at once, which significantly limits the number of other qubits to which the superconducting qubit can be coupled.

In stark contrast, various embodiments described herein can address this technical problem. Specifically, systems/techniques described herein can include physically spacing the coupler arms of a multi-order filter close together, which is exactly the opposite of what existing techniques teach. Such close spacing can yield non-negligible cross-capacitive interactions between the coupler arms (e.g., the magnitudes of such cross-capacitive interactions can be less than but still within an order of magnitude of the least of the direct qubit-to-coupler-arm capacitance values). Because, such coupler arms can be physically spaced close together, the multi-order filter can block significantly less surface area and/or perimeter of the superconducting qubit when various embodiments of the invention are implemented. Moreover, because the non-negligible cross-capacitive interactions can be easily compensated and/or accounted for by tuning the values of the direct qubit-to-coupler-arm capacitances, such non-negligible cross-capacitive interactions can be considered as not problematic (e.g., can fail to adversely affect the performance and/or behavior of the superconducting qubit). Thus, when various embodiments of the invention are implemented, the multi-order filter can take up significantly less space without negatively influencing the superconducting qubit. Such embodiments, which are completely opposite to existing techniques, certainly constitute a concrete and tangible technical improvement in the field of qubits.

It should be appreciated that the figures and the herein disclosure describe non-limiting examples of various embodiments of the invention and are not necessarily drawn to scale.

FIG. 1 illustrates a block diagram of an example, non-limiting system 100 that can facilitate space-saving coupler arm arrangement for superconducting qubits in accordance with one or more embodiments described herein.

In various embodiments, there can be a transmon qubit 102. In various aspects, as shown, the transmon qubit 102 can comprise a Josephson junction 104, a planar capacitor pad 106, and/or a planar capacitor pad 108. In various instances, the Josephson junction 104 can be any suitable type of Josephson junction (e.g., any suitable circuit structure that includes two superconductors coupled by a weak link across which a supercurrent can flow in the absence of applied voltage). For example, the Josephson junction 104 can be an S-I-S Josephson junction (e.g., two superconductors separated by a thin insulator), an S-N-S Josephson junction (e.g., two superconductors separated by a thin non-superconductor), and/or an S-c-S Josephson junction (e.g., two superconductors separated by a thin physical constriction). In various cases, the planar capacitor pad 106 can be any suitable type of planar capacitor pad. For example, the planar capacitor pad 106 can be made up of any suitable superconducting materials, and the planar capacitor pad 106 can exhibit any suitable size, shape, and/or dimensions. Similarly, the planar capacitor pad 108 can be any suitable type of planar capacitor pad. For instance, the planar capacitor pad 108 can be made up of any suitable superconducting materials, and the planar capacitor pad 108 can exhibit any suitable size, shape, and/or dimensions. Although FIG. 1 depicts the planar capacitor pad 106 and the planar capacitor pad 108 as having the same size, shape, dimensions, and/or materials, this is a mere non-limiting example for ease of illustration. In various aspects, the planar capacitor pad 106 and the planar capacitor pad 108 can have the same and/or different sizes, shapes, dimensions, and/or materials as each other. In any case, the planar capacitor pad 106 and the planar capacitor pad 108 can be considered as collectively forming a planar capacitor that shunts the Josephson junction 104. Thus, such planar capacitor and the Josephson junction 104 can collectively be considered as forming the transmon qubit 102.

As those having ordinary skill in the art will appreciate, the transmon qubit 102 can be fabricated and/or manufactured on any suitable substrate (not shown), such as a silicon wafer, via any suitable microfabrication and/or nanofabrication techniques (e.g., photolithography, deposition, double-angle evaporation).

In various embodiments, as shown, there can be a coupler arm 110 and a coupler arm 112. In various aspects, the coupler arm 110 and the coupler arm 112 can belong to a multi-order filter (not fully shown in FIG. 1) that couples the transmon qubit 102 to some other transmon qubit (not shown). Accordingly, the coupler arm 110 can be considered as representing and/or otherwise corresponding to one electrically conductive path of the multi-order filter (e.g., one electrically conductive path coupling the transmon qubit 102 to the another transmon qubit), and the coupler arm 112 can be considered as representing and/or otherwise corresponding to another electrically conductive path of the multi-order filter (e.g., another electrically conductive path coupling the transmon qubit 102 to the another transmon qubit). In various aspects, the coupler arm 110 can be made up of any suitable superconducting materials, and the coupler arm 110 can exhibit any suitable size, shape, and/or dimensions. Likewise, the coupler arm 112 can be made up of any suitable superconducting materials, and the coupler arm 112 can exhibit any suitable size, shape, and/or dimensions. In any case, the coupler arm 110 and/or the coupler arm 112 can be considered as superconducting wires and/or cables of the multi-order filter. Although FIG. 1 depicts the coupler arm 110 as being composed of the same material as the coupler arm 112, this is a mere non-limiting example for ease of illustration. In various cases, the coupler arm 110 and the coupler arm 112 can have the same and/or different sizes, shapes, dimensions, and/or materials as each other. Moreover, although FIG. 1 depicts the coupler arm 110 and the coupler arm 112 as being composed of the same material as the planar capacitor pad 106 and the planar capacitor pad 108, this is a mere non-limiting example for ease of illustration. In various cases, the coupler arm 110 and/or the coupler arm 112 can be composed of the same and/or different materials as the planar capacitor pad 106 and/or the planar capacitor pad 108.

As those having ordinary skill in the art will appreciate, the coupler arm 110 and/or the coupler arm 112 can be fabricated and/or manufactured on any suitable substrate (e.g., the same substrate as the transmon qubit 102), via any suitable microfabrication and/or nanofabrication techniques (e.g., photolithography, deposition, double-angle evaporation).

Because FIG. 1 depicts two coupler arms (e.g., 110 and 112), the multi-order filter that couples the transmon qubit 102 to the another transmon qubit can be considered as a second-order filter (e.g., a filter that couples a pair of qubits via two electrically conductive paths). However, this is a mere non-limiting example for ease of illustration. In various instances, those having ordinary skill in the art will appreciate that the multi-order filter can include more than two coupler arms. That is, the multi-order filter can, in various embodiments, include n coupler arms, for any suitable positive integer n greater than or equal to 2, and such n coupler arms can represent n electrically conductive paths between the transmon qubit 102 and the another transmon qubit.

In various aspects, as shown, the coupler arm 110 can be placed in physical proximity to the planar capacitor pad 108, such that the coupler arm 110 can capacitively interact with the planar capacitor pad 108. In other words, there can be a direct capacitance between the coupler arm 110 and the planar capacitor pad 108. Similarly, as shown, the coupler arm 112 can be placed in physical proximity to the planar capacitor pad 108, such that the coupler arm 112 can capacitively interact with the planar capacitor pad 108. That is, there can be another direct capacitance between the coupler arm 112 and the planar capacitor pad 108.

Furthermore, in various cases, the coupler arm 110 and the coupler arm 112 can be placed within physical proximity to each other. More specifically, as shown, the coupler arm 110 and the coupler arm 112 can be physically separated from each other by a separation distance 114. Although FIG. 1 depicts the coupler arm 110 and the coupler arm 112 as running parallel with each other so that the separation distance 114 is uniform along the longitudinal directions of the coupler arm 110 and the coupler arm 112, this is a mere non-limiting example for ease of illustration. In various aspects, the coupler arm 110 and the coupler arm 112 can run not entirely parallel to each other; in such case, the separation distance 114 can be considered as the smallest distance separating the coupler arm 110 from the coupler arm 112. In other words, at the point where the coupler arm 110 and the coupler arm 112 are closest together, they can be separated by the separation distance 114. In any case, the separation distance 114 can be any suitable distance that causes the coupler arm 110 to capacitively interact in a non-negligible fashion with the coupler arm 112. In particular, the separation distance 114 can be small enough to give rise to a parasitic capacitance that crosses from the coupler arm 110 to the coupler arm 112, where the value of such parasitic capacitance can be within an order of magnitude of the direct capacitances that arise between the planar capacitor pad 108 and the coupler arm 110 and/or the coupler arm 112. This is explained in more detail with respect to FIG. 2.

Figure 2:
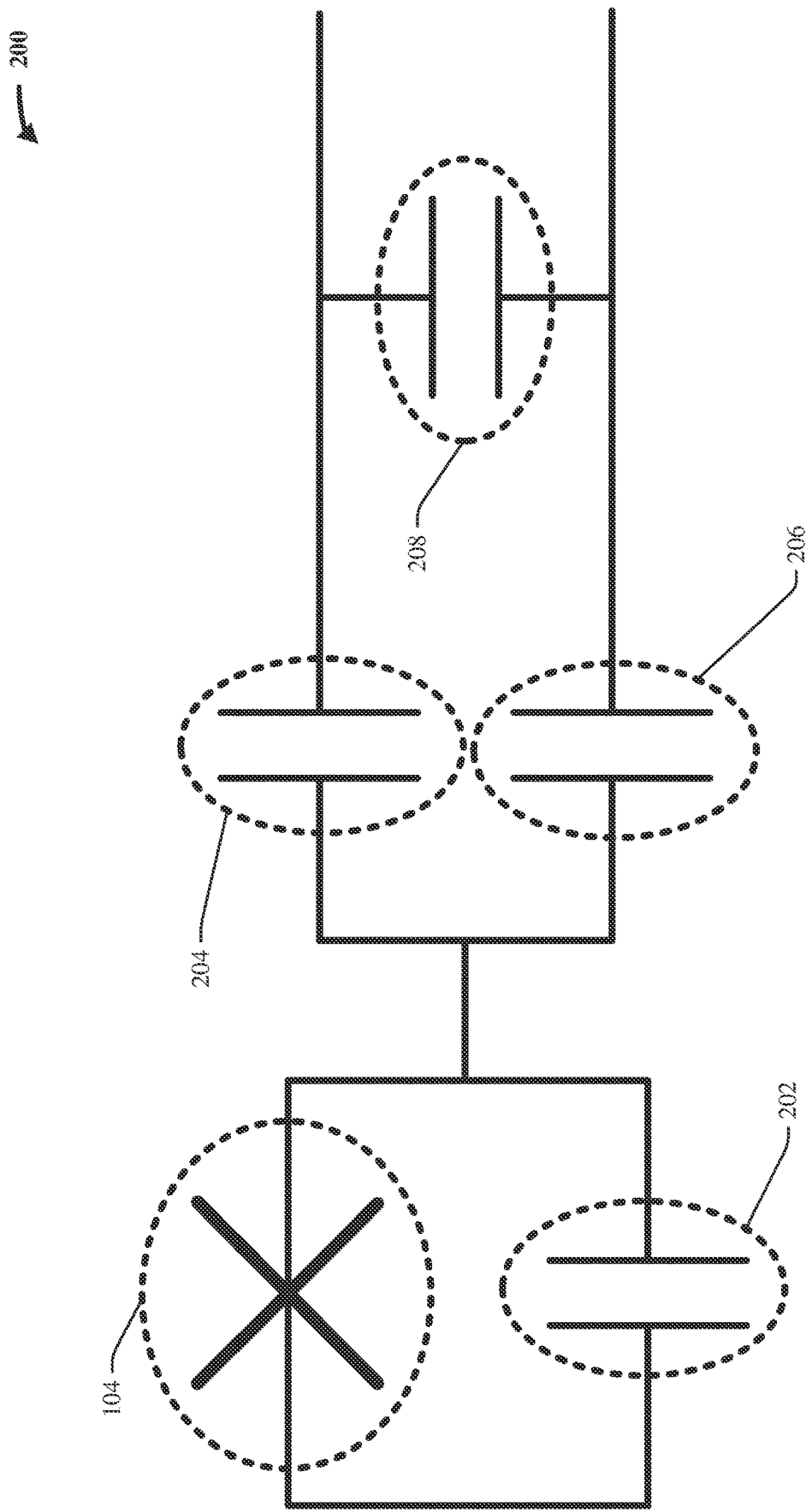
FIG. 2 illustrates a circuit diagram of an example, non-limiting system that facilitates space-saving coupler arm arrangement for superconducting qubits in accordance with one or more embodiments described herein.

FIG. 2 illustrates a circuit diagram 200 of an example, non-limiting system that can facilitate space-saving coupler arm arrangement for superconducting qubits in accordance with one or more embodiments described herein. In other words, the circuit diagram 200 can be considered as representing various electrical characteristics of the system 100.

In various aspects, as shown in FIG. 2, there can be a capacitance 202 that is in parallel with the Josephson junction 104. In various instances, the capacitance 202 can be considered as the direct capacitive interaction that arises between the planar capacitor pad 106 and the planar capacitor pad 108. Accordingly, the capacitance 202 can be considered as shunting the Josephson junction 104. In various cases, the Josephson junction 104 and the capacitance 202 can be considered as representing the transmon qubit 102. As those having ordinary skill in the art will appreciate, the capacitance 202 can have any suitable magnitude as desired (e.g., the magnitude of the capacitance 202 can be a function of the size, shape, dimensions, and/or material of the planar capacitor pad 106 and/or can be a function of the size, shape, dimensions, and/or material of the planar capacitor pad 108).

In various instances, as shown in FIG. 2, there can be a capacitance 204 and a capacitance 206 that are in parallel with each other and that are collectively in series with the transmon qubit 102. In various cases, the capacitance 204 can be considered as the direct capacitive interaction that occurs between the planar capacitor pad 108 and the coupler arm 110. Similarly, in various aspects, the capacitance 206 can be considered as the direct capacitive interaction that occurs between the planar capacitor pad 108 and the coupler arm 112. As those having ordinary skill in the art will appreciate, the capacitance 204 can have any suitable magnitude as desired (e.g., the magnitude of the capacitance 204 can be a function of the size, shape, dimensions, and/or material of the planar capacitor pad 108 and/or can be a function of the size, shape, dimensions, and/or material of the coupler arm 110). Likewise, as those having ordinary skill in the art will understand, the capacitance 206 can have any suitable magnitude as desired (e.g., the magnitude of the capacitance 206 can be a function of the size, shape, dimensions, and/or material of the planar capacitor pad 108 and/or can be a function of the size, shape, dimensions, and/or material of the coupler arm 112). Without loss of generality, suppose that the capacitance 206 is less than the capacitance 204.

In various aspects, as shown in FIG. 2, there can be a parasitic capacitance 208 that cross-couples the electrical line hosting the capacitance 204 and the electrical line hosting the capacitance 206. In various instances, the parasitic capacitance 208 can be considered as representing the cross-capacitive interaction that arises between the coupler arm 110 and the coupler arm 112 due to the separation distance 114. In various cases, the separation distance 114 can be controllably selected and/or chosen such that the parasitic capacitance 208 is less than (and/or equal to) the lesser of the capacitance 204 and the capacitance 206, and such that the parasitic capacitance 208 is simultaneously within an order of magnitude of the lesser of the capacitance 204 and the capacitance 206. In other words, the magnitude of the parasitic capacitance 208 can be less than (and/or equal to) the lesser of the capacitance 204 and the capacitance 206, and the magnitude of the parasitic capacitance 208 can be greater than (and/or equal to) 10% of the lesser of the capacitance 204 and the capacitance 206.

In some cases, the magnitude of the parasitic capacitance 208 can be between 10% and 25% of the lesser of the capacitance 204 and the capacitance 206. For example, the parasitic capacitance 208 can be within any suitable margin of 10% of such lesser capacitance, can be within any suitable margin of 11% of such lesser capacitance, can be within any suitable margin of 12% of such lesser capacitance, can be within any suitable margin of 13% of such lesser capacitance, can be within any suitable margin of 14% of such lesser capacitance, can be within any suitable margin of 15% of such lesser capacitance, can be within any suitable margin of 16% of such lesser capacitance, can be within any suitable margin of 17% of such lesser capacitance, can be within any suitable margin of 18% of such lesser capacitance, can be within any suitable margin of 19% of such lesser capacitance, can be within any suitable margin of 20% of such lesser capacitance, can be within any suitable margin of 21% of such lesser capacitance, can be within any suitable margin of 22% of such lesser capacitance, can be within any suitable margin of 23% of such lesser capacitance, can be within any suitable margin of 24% of such lesser capacitance, can be within any suitable margin of 25% of such lesser capacitance, and/or can be any suitable intermediary and/or decimal value between such percentages. In yet other cases, the magnitude of the parasitic capacitance 208 can be between 25% and 100% of the lesser of the capacitance 204 and the capacitance 206 (e.g., can be any integer percentage value and/or intermediary/decimal percentage value in such range). In any case, the parasitic capacitance 208 can be considered as non-negligible and/or otherwise comparable to (e.g., on the same order of magnitude as) the lesser of the capacitance 204 and the capacitance 206.

Since the separation distance 114 can give rise to the parasitic capacitance 208 which can have a non-negligible magnitude, the size of the separation distance 114 can be small compared to the overall length and/or size of the planar capacitor pad 108. Accordingly, as shown in FIG. 1, the coupler arm 110 and the coupler arm 112 can be considered as taking up and/or blocking a small portion of the perimeter of the transmon qubit 102. In various instances, this can leave a large portion 116 of the perimeter of the transmon qubit 102 (e.g., of the perimeter of the planar capacitor pad 108) open and/or otherwise available for coupling/interfacing with other multi-order filters. To help better understand this space-saving benefit, consider FIGS. 3-4.

Figure 3:
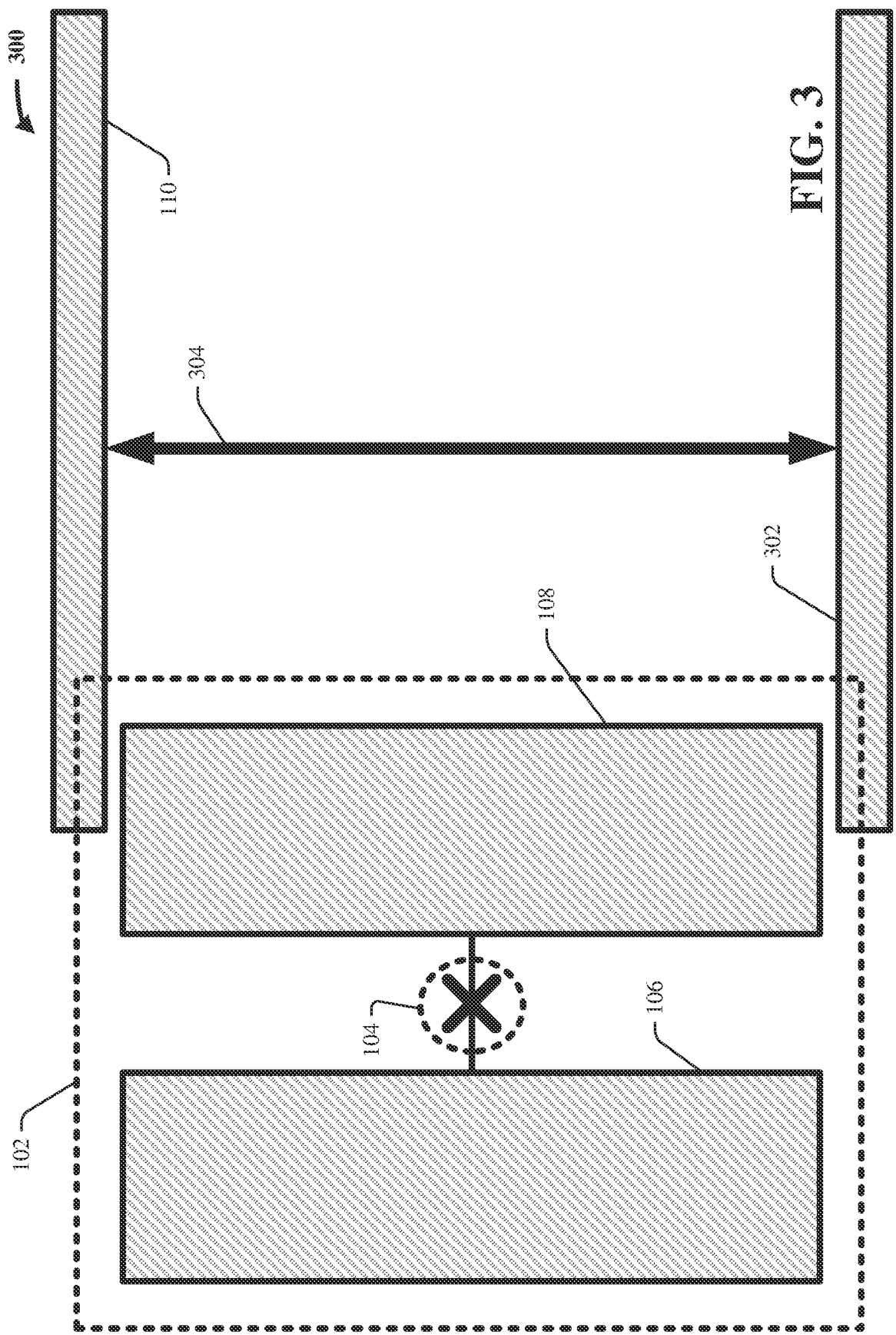
FIG. 3 illustrates a block diagram of a system that facilitates non-space-saving coupler arm arrangement.

FIG. 3 illustrates a block diagram of a system 300 that facilitates non-space-saving coupler arm arrangement. As shown, FIG. 3 depicts the transmon qubit 102 (comprising the Josephson junction 104, the planar capacitor pad 106, and the planar capacitor pad 108) and the coupler arm 110. In contrast with FIG. 1, however, FIG. 3 illustrates a coupler arm 302 instead of the coupler arm 112.

In various aspects, the coupler arm 110 and the coupler arm 302 can belong to the multi-order filter (e.g., the coupler arm 110 can be considered as representing and/or otherwise corresponding to one electrically conductive path of the multi-order filter, and the coupler arm 302 can be considered as representing and/or otherwise corresponding to another electrically conductive path of the multi-order filter). In various cases, the coupler arm 302 can exhibit any suitable size, shape, dimensions, and/or superconducting materials, whether the same as and/or different from those of the coupler arm 110.

However, unlike the coupler arm 112, the coupler arm 302 can be placed not in physical proximity with the coupler arm 110. More specifically, as shown, the coupler arm 110 and the coupler arm 302 can be physically separated from each other by a separation distance 304, where the separation distance 304 can be much larger and/or much greater than the separation distance 114. Accordingly, the separation distance 304 can prevent any non-negligible parasitic capacitance from arising between the coupler arm 110 and the coupler arm 302. This is explained in more detail with respect to FIG. 4.

Figure 4:
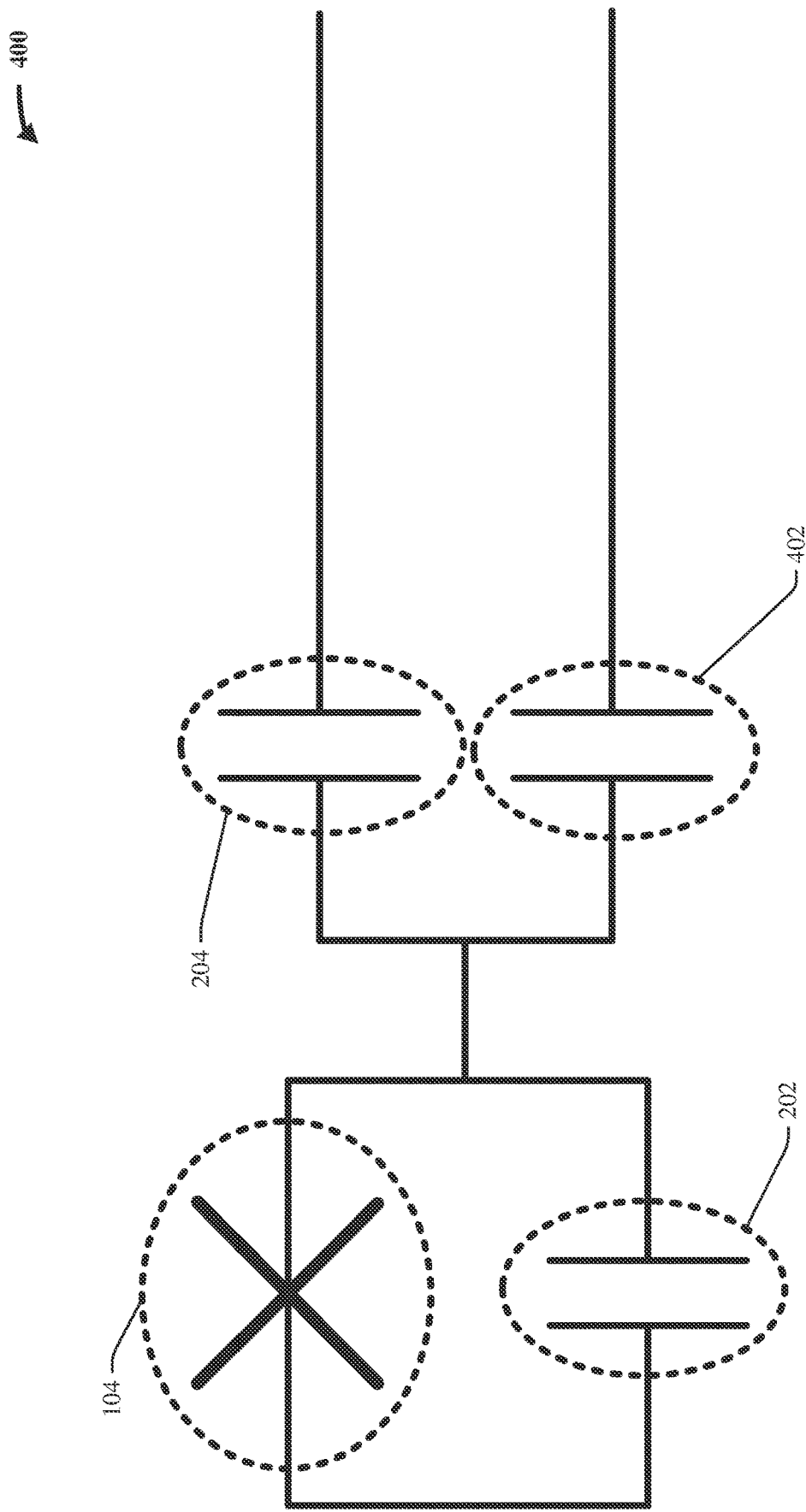
FIG. 4 illustrates a circuit diagram of a system that facilitates non-space-saving coupler arm arrangement.

FIG. 4 illustrates a circuit diagram 400 of a system that facilitates non-space-saving coupler arm arrangement. In other words, the circuit diagram 400 can be considered as representing various electrical characteristics of the system 300.

In various aspects, as shown in FIG. 4, there can be the capacitance 202 that is in parallel with the Josephson junction 104 (e.g., the capacitance 202 can shunt the Josephson junction 104). As also shown, there can be the capacitance 204 that arises between the coupler arm 110 and the planar capacitor pad 108. Moreover, in various instances, there can be a capacitance 402 that is in parallel with the capacitance 204. In various cases, the capacitance 402 can be considered as the direct capacitive interaction that occurs between the planar capacitor pad 108 and the coupler arm 302. As those having ordinary skill in the art will appreciate, the capacitance 402 can have any suitable magnitude as desired (e.g., the magnitude of the capacitance 402 can be a function of the size, shape, dimensions, and/or material of the planar capacitor pad 108 and/or can be a function of the size, shape, dimensions, and/or material of the coupler arm 302). Again, without loss of generality, suppose that the capacitance 402 is less than the capacitance 204.

Furthermore, as shown in FIG. 4, there can be no parasitic capacitance that cross-couples the electrical line hosting the capacitance 204 and the electrical line hosting the capacitance 402. In other words, the parasitic capacitance 208 can be absent from FIG. 4. More specifically, because the separation distance 304 can be very large in comparison to the separation distance 114, the separation distance 304 can prevent a cross-capacitive interaction between the coupler arm 110 and the coupler arm 302. In some cases, even if there is still some non-zero cross-capacitive interaction between the coupler arm 110 and the coupler arm 302, such cross-capacitive interaction can be so small (e.g., several orders of magnitude below the lesser of the capacitance 204 and the capacitance 402) as to be considered negligible.

Since the separation distance 304 can prevent any non-negligible parasitic capacitance between the coupler arm 110 and the coupler arm 302, the size of the separation distance 304 can be very large compared to the overall length and/or size of the planar capacitor pad 108. Indeed, in some cases, as shown in FIG. 3, the separation distance 304 can be nearly the entire length of the planar capacitor pad 108. Accordingly, as shown in FIG. 3, the coupler arm 110 and the coupler arm 302 can be considered as taking up and/or blocking a large portion of the perimeter of the transmon qubit 102. In various instances, this can leave a very little to no portion of the perimeter of the transmon qubit 102 (e.g., of the perimeter of the planar capacitor pad 108) open and/or otherwise available for coupling/interfacing with other multi-order filters (e.g., 116 is not shown in FIG. 3).

In other words, separating the coupler arms of a multi-order filter by the separation distance 114 can cause the multi-order filter to take up very little on-chip space (e.g., as shown in FIG. 1, there is much room around the perimeter of the transmon qubit 102 for the coupler arms of other multi-order filters to interface with the transmon qubit 102). In stark contrast, separating the coupler arms of a multi-order filter by the separation distance 304 can cause the multi-order filter to take up very much on-chip space (e.g., as shown in FIG. 3, there is much less room around the perimeter of the transmon qubit 102 for the coupler arms of other multi-order filters to interface with the transmon qubit 102).

Those having ordinary skill in the art will appreciate that FIG. 1 depicts non-limiting example locations of the coupler arm 110 and the coupler arm 112 around the perimeter of the transmon qubit 102. Those having ordinary skill in the art will appreciate that the coupler arm 110 and the coupler arm 112 can be placed in any other suitable locations around the perimeter of the transmon qubit 102, provided that the coupler arm 110 and the coupler arm 112 can capacitively interact with the same planar capacitor pad as each other (e.g., 108), and provided that the coupler arm 110 and the coupler arm 112 are separated by the separation distance 114.

Now, although the multi-order filter shown in FIG. 1 takes up much less physical space around the transmon qubit 102 than the multi-order filter shown in FIG. 3, the multi-order filter shown in FIG. 1 can experience the parasitic capacitance 208, whereas the multi-order filter shown in FIG. 3 does not experience the parasitic capacitance 208. Existing techniques teach that the parasitic capacitance 208 negatively affects the performance of the multi-order filter and/or of the transmon qubit 102. However, the present inventors experimentally discovered that, in various aspects, the parasitic capacitance 208 can actually not negatively affect the performance of the multi-order filter and/or of the transmon qubit 102. Specifically, the present inventors realized that the parasitic capacitance 208 can be compensated and/or accounted for by appropriately tuning, as described herein, at least one of the capacitance 204 and/or the capacitance 206. More specifically, the present inventors realized that the parasitic capacitance 208 can, in some cases, be compensated and/or accounted for by appropriately increasing the lesser of the capacitance 204 and the capacitance 206. This is explained in more detail below.

Consider again the circuit diagram 200 and the circuit diagram 400. As mentioned above, the capacitance 206 can be lesser than the capacitance 204 without loss of generality, and the capacitance 402 can be lesser than the capacitance 204 without loss of generality. In various aspects, it can be the case that transmon qubit 102 exhibits a desired quantum electrical behavior (e.g., a desired J-interaction profile, a desired ZZ-interaction profile) when the transmon qubit 102 is coupled to the multi-order filter of FIG. 3.

Now, if the capacitance 206 is equal to the capacitance 402, then it can be the case that the transmon qubit 102 exhibits a different quantum electrical behavior (e.g., different J-interaction profile, different ZZ-interaction profile) when the transmon qubit 102 is coupled to the multi-order filter of FIG. 1. In other words, the parasitic capacitance 208 can be considered as adversely affecting the performance of the transmon qubit 102, when identical coupler-to-transmon direct capacitances are implemented in the multi-order filter (e.g., when the capacitance 206 is equal to the capacitance 402).

However, the present inventors experimentally verified that there exist one or more values of the capacitance 206 that are greater than the capacitance 402, where the parasitic capacitance 208 is less than but still within an order of magnitude of such one or more values, and where such one or more values cause the transmon qubit 102 to exhibit the desired quantum electrical behavior. In other words, appropriately increasing the capacitance 206 to be greater than the capacitance 402 can, in some cases, offset negative side-effects of the parasitic capacitance 208. Accordingly, it is possible to tune the value of the capacitance 206 such that the multi-order filter of FIG. 1 enables the transmon qubit 102 to behave substantially equivalently as compared to the multi-order filter of FIG. 3, while simultaneously saving significant on-chip space as compared to the multi-order filter of FIG. 3. So, the multi-order filter of FIG. 1 can be considered as a concrete and tangible improvement as compared to the multi-order filter of FIG. 3. As those having ordinary skill in the art will appreciate, the capacitance 206 can be tuned by controllably adjusting the size, shape, dimensions, and/or materials of the coupler arm 112 during fabrication.

As those having ordinary skill in the art will appreciate, the exact value of the capacitance 206 (e.g., the exact amount by which the capacitance 206 should be greater than the capacitance 402 so as to cause the transmon qubit 102 to exhibit the desired quantum electrical behavior) can uniquely vary based on operational context. For instance, the value of the capacitance 206 that compensates for the parasitic capacitance 208 can depend upon the parasitic capacitance 208, can depend upon the capacitance 204, and/or can depend upon the desired quantum electrical behavior of the transmon qubit 102. Therefore, those having ordinary skill in the art will appreciate that there is no single formula for deterministically and universally computing which value of the capacitance 206 enables the transmon qubit 102 to exhibit the desired quantum electrical behavior. Instead, those having ordinary skill in the art will understand that standard computer simulation and/or standard experimentation can be implemented to identify an appropriate value of the capacitance 206 for any given operational context.

For example, a desired operational context can be given. That is, a desired quantum electrical behavior (e.g., a desired J-interaction profile, a desired ZZ-interaction profile) of the transmon qubit 102 can be given, a desired value of the parasitic capacitance 208 can be given, and a desired value of the capacitance 204 can be given. With such desired operational context, iterative computer simulations and/or iterative experiments can be performed so as to sweep the value of the capacitance 206 until an appropriate value is identified. More specifically, at each simulation/experimental iteration, a new potential value of the capacitance 206 (e.g., where such new value is greater than the capacitance 402) can be selected, the quantum electrical behavior of the transmon qubit 102 can be probed and/or measured (e.g., such as via a Ramsey experiment), and the probed/measured quantum electrical behavior can be compared to the desired quantum electrical behavior. If the probed/measured quantum electrical behavior is not equal to (and/or not within any suitable threshold margin of) the desired quantum electrical behavior, then a next simulation/experimental iteration can be commenced with a new potential value of the capacitance 206. On the other hand, if the probed/measured quantum electrical behavior is equal to (and/or within any suitable threshold margin of) the desired quantum electrical behavior, then the value of the capacitance 206 that was tested during such simulation/experimental iteration can be considered as compensating and/or accounting for the parasitic capacitance 208. In this way, a suitable value of the capacitance 206 can be identified, such that the capacitance 206 is greater than the capacitance 402, such that the parasitic capacitance 208 is less than and/or equal to the capacitance 206 yet still within an order of magnitude of the capacitance 206, and such that the transmon qubit 102 exhibits the desired quantum electrical behavior. In some cases, the present inventors found that the parasitic capacitance 208 can be between 10% and 25% of the selected value of the capacitance 206, inclusively. Those having ordinary skill in the art will appreciate that this is not undue experimentation.

Although the above discussion mainly focuses on modulating the value of the capacitance 206 so as to compensate for the parasitic capacitance 208, this is a mere non-limiting example. In various cases, the capacitance 204 can be experimentally swept to identify a value of the capacitance 204 that compensates for the parasitic capacitance 208. In various other cases, both the capacitance 204 and the capacitance 206 can be experimentally swept to identify values that compensate for the parasitic capacitance 208. More generally, when given a transmon qubit and a multi-order filter having n coupler arms for any suitable positive integer n greater than or equal to 2, there can be n transmon-to-coupler-arm direct capacitances with which the multi-order filter interfaces with the transmon qubit, and any (e.g., one or more) of such n transmon-to-coupler-arm direct capacitances can be experimentally swept (e.g., swept up or swept down) so as to identify values that compensate for any parasitic capacitances that arise between the n coupler arms. In other words, those having ordinary skill in the art will appreciate that the n transmon-to-coupler-arm direct capacitances can be considered as configurable parameters which can be controlled so as to compensate for parasitic capacitances that occur between the n coupler arms.

As mentioned above, the herein teachings can be applied to any suitable multi-order filter as desired. As a specific, non-limiting example, the multi-order filter can be a ZZ cancellation coupler, as shown with respect to FIGS. 5-8.

Figure 5:
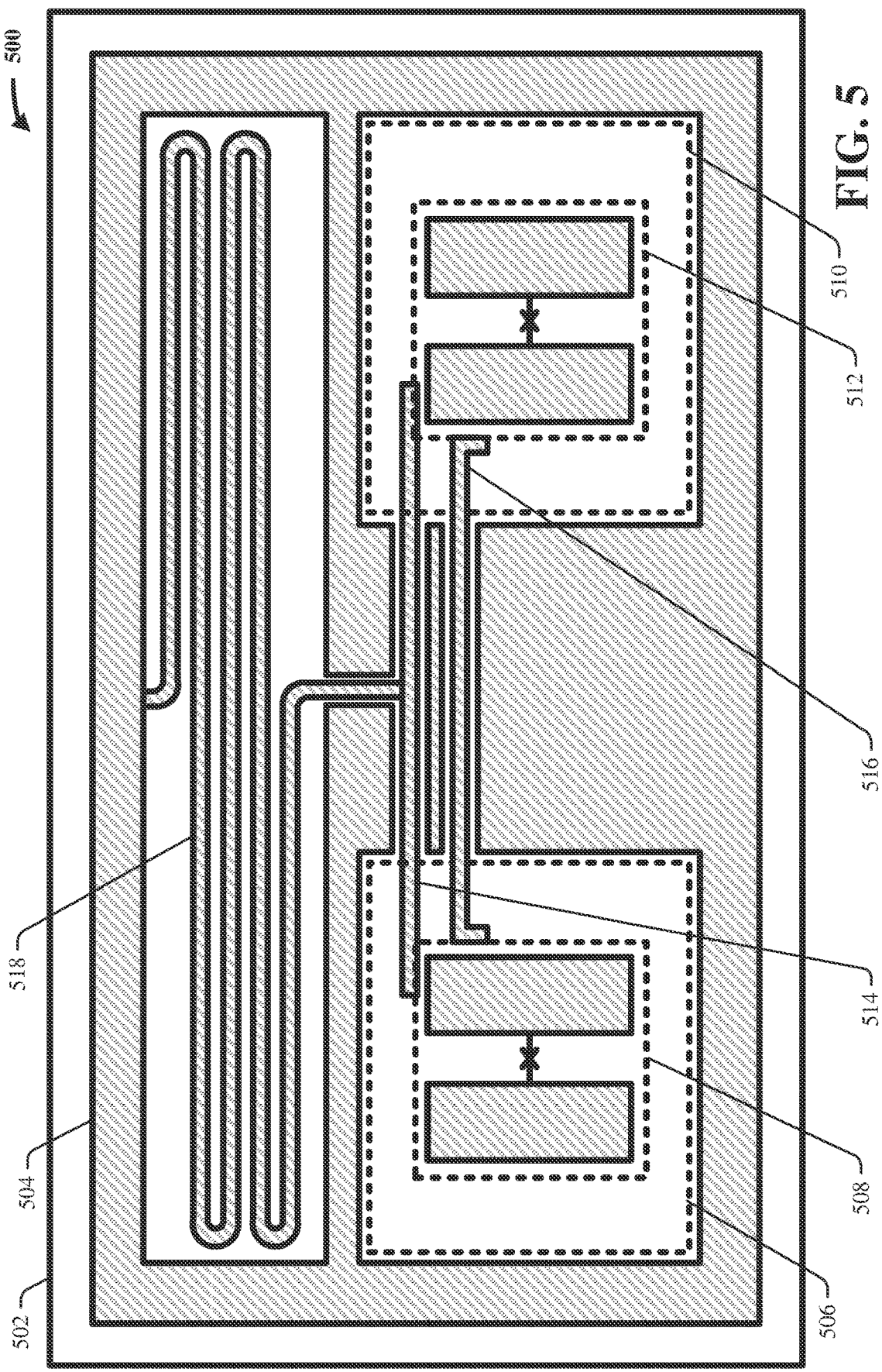
FIG. 5 illustrates a block diagram of an example, non-limiting system including a ZZ cancellation coupler that facilitates space-saving coupler arm arrangement for superconducting qubits in accordance with one or more embodiments described herein.

FIG. 5 illustrates a block diagram of an example, non-limiting system 500 including a ZZ cancellation coupler that can facilitate space-saving coupler arm arrangement for superconducting qubits in accordance with one or more embodiments described herein.

In various embodiments, there can be a substrate 502. In various aspects, the substrate 502 can be any suitable quantum substrate as desired, such as a silicon wafer. In various instances, the substrate 502 can exhibit any suitable size, shape, and/or dimensions as desired.

In various embodiments, there can be a ground plane 504 on the substrate 502. In various aspects, the ground plane 504 can be composed of any suitable superconducting material as desired. In various instances, the ground plane 504 can exhibit any suitable size, shape, and/or dimensions as desired. As those having ordinary skill in the art will appreciate, the ground plane 504 can be fabricated on the substrate 502 via any suitable microfabrication and/or nanofabrication techniques (e.g., photolithography, deposition, double-angle evaporation).

In various embodiments, as shown, there can be a qubit pocket 506 in the ground plane 504, where the qubit pocket 506 houses a transmon qubit 508. In various cases, the transmon qubit 508 can comprise a Josephson junction and a planar capacitor that shunts the Josephson junction. Likewise, in various instances, there can be a qubit pocket 510 in the ground plane 504, where the qubit pocket 510 houses a transmon qubit 512. In various cases, the transmon qubit 512 can comprise a Josephson junction and a planar capacitor that shunts the Josephson junction. In various cases, the planar capacitor of the transmon qubit 508 can have the same and/or different size, shape, dimensions, and/or materials than the planar capacitor of the transmon qubit 512. As those having ordinary skill in the art will appreciate, the qubit pocket 506 can be etched into the ground plane 504, and the transmon qubit 508 can be fabricated on the substrate 502 within the qubit pocket 506 via any suitable microfabrication and/or nanofabrication techniques (e.g., photolithography, deposition, double-angle evaporation). Similarly, the qubit pocket 510 can be etched into the ground plane 504, and the transmon qubit 512 can be fabricated on the substrate 502 within the qubit pocket 510 via any suitable microfabrication and/or nanofabrication techniques (e.g., photolithography, deposition, double-angle evaporation).

In various embodiments, as shown, the transmon qubit 508 and the transmon qubit 512 can be coupled together via a ZZ cancellation coupler. More specifically, the ZZ cancellation coupler can include a coupler arm 514, a coupler arm 516, and a $\lambda/4$ resonator 518. In various instances, the coupler arm 514 can exhibit any suitable size, shape, dimensions, and/or superconducting materials as desired (e.g., although the coupler arm 514 is depicted as being straight, this is a non-limiting example for ease of illustration; in some cases, the coupler arm 514 can meander). Likewise, the coupler arm 516 can exhibit any suitable size, shape, dimensions, and/or superconducting materials as desired, whether the same as and/or different from those of the coupler arm 514 (e.g., although the coupler arm 516 is depicted as being straight, this is a non-limiting example for ease of illustration; in some cases, the coupler arm 516 can meander). Similarly, the $\lambda/4$ resonator 518 can exhibit any suitable size, shape, dimensions, and/or superconducting materials as desired. As those having ordinary skill in the art will appreciate, the coupler arm 514, the coupler arm 516, and the $\lambda/4$ resonator 518 can be fabricated on the substrate 502 via any suitable microfabrication and/or nanofabrication techniques (e.g., photolithography, deposition, double-angle evaporation).

As shown in FIG. 5, one end of the coupler arm 516 can be placed in physical proximity to the transmon qubit 508 (e.g., in physical proximity to one capacitor pad of the transmon qubit 508), and the other end of the coupler arm 516 can be placed in physical proximity to the transmon qubit 512 (e.g., in physical proximity to one capacitor pad of the transmon qubit 512). Accordingly, the one end of the coupler arm 516 can capacitively interact with the transmon qubit 508, and the other end of the coupler arm 516 can capacitively interact with the transmon qubit 512, thereby providing an electrically conductive path between the transmon qubit 508 and the transmon qubit 512. In various cases, the coupler arm 516 can thus be considered as a direct capacitive coupling between the transmon qubit 508 and the transmon qubit 512.

As also shown in FIG. 5, one end of the coupler arm 514 can be placed in physical proximity to the transmon qubit 508 (e.g., in physical proximity to one capacitor pad of the transmon qubit 508), and the other end of the coupler arm 514 can be placed in physical proximity to the transmon qubit 512 (e.g., in physical proximity to one capacitor pad of the transmon qubit 512). Accordingly, the one end of the coupler arm 514 can capacitively interact with the transmon qubit 508, and the other end of the coupler arm 514 can capacitively interact with the transmon qubit 512, thereby providing another electrically conductive path between the transmon qubit 508 and the transmon qubit 512. Moreover, as shown, a middle portion of the coupler arm 514 can be in conductive contact with one end of the $\lambda/4$ resonator 518, and the other end of the $\lambda/4$ resonator 518 can be in conductive contact with the ground plane 504. Thus, in various cases, the coupler arm 514 and the $\lambda/4$ resonator 518 can collectively be considered as a $\lambda/4$ resonator coupling between the transmon qubit 508 and the transmon qubit 512.

Again, the coupler arm 516, the coupler arm 514, and the $\lambda/4$ resonator 518 can together be considered as a ZZ cancellation coupler that couples the transmon qubit 508 to the transmon qubit 512.

Note that, as shown in FIG. 5, the coupler arm 514 and the coupler arm 516 can be in close physical proximity to each other within the qubit pocket 506. As described above, such physical proximity can cause a parasitic capacitance to arise between the coupler arm 514 and the coupler arm 516 within the qubit pocket 506. Similarly, as shown, the coupler arm 514 and the coupler arm 516 can also be in close physical proximity to each other within the qubit pocket 510. Again, such physical proximity can cause another parasitic capacitance to arise between the coupler arm 514 and the coupler arm 516 within the qubit pocket 510. This is further discussed with respect to FIG. 6.

Figure 6:
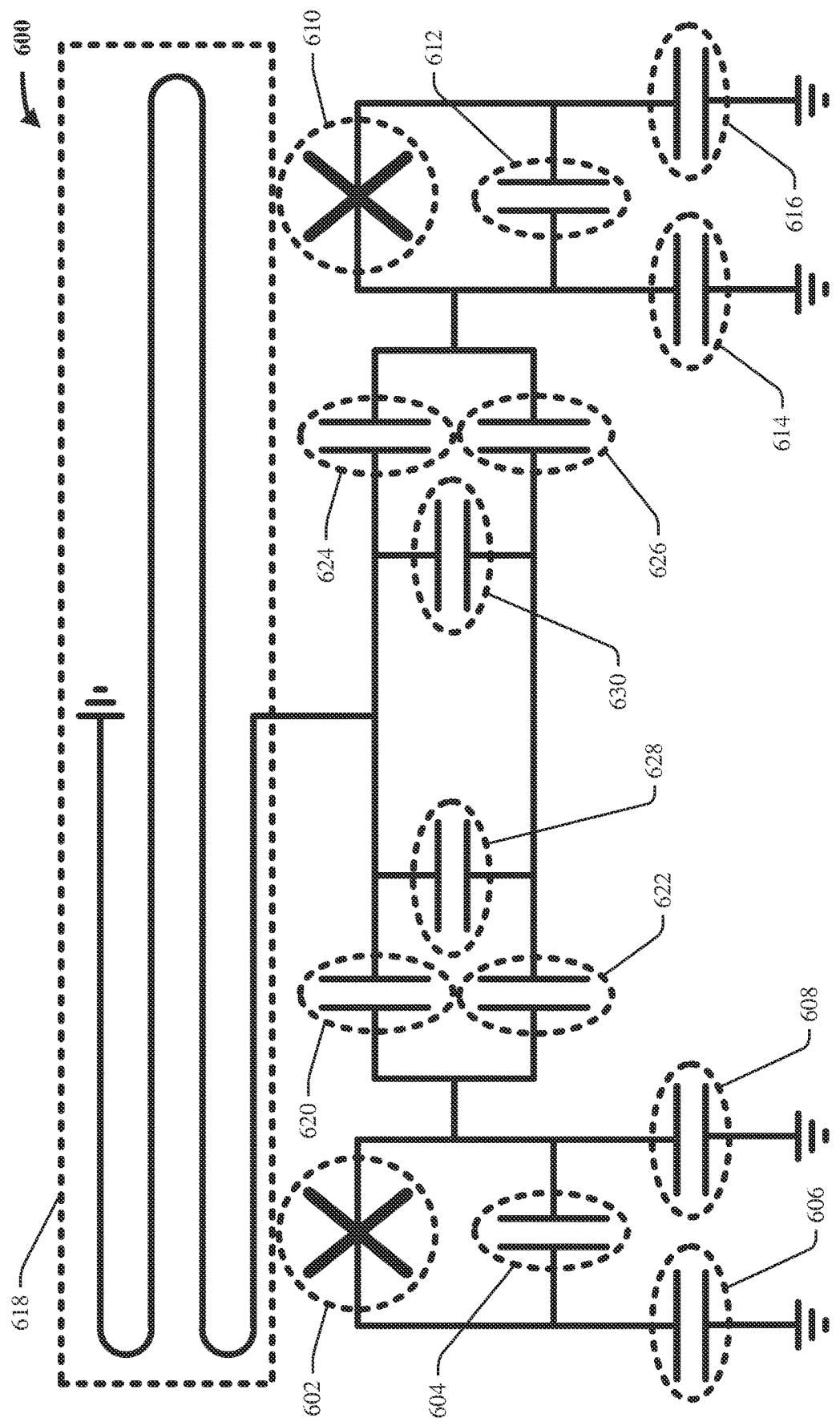
FIG. 6 illustrates a circuit diagram of an example, non-limiting system including a ZZ cancellation coupler that facilitates space-saving coupler arm arrangement for superconducting qubits in accordance with one or more embodiments described herein.

FIG. 6 illustrates a circuit diagram 600 of an example, non-limiting system including a ZZ cancellation coupler that can facilitate space-saving coupler arm arrangement for superconducting qubits in accordance with one or more embodiments described herein. In other words, the circuit diagram 600 can be considered as representing various electrical characteristics of the system 500.

As shown, there can be a Josephson junction 602, which can correspond to the Josephson junction of the transmon qubit 508. There can also be a capacitance 604 that is in parallel with the Josephson junction 602, which can correspond to the planar capacitor of the transmon qubit 508 (e.g., the capacitance 604 can shunt the Josephson junction 602). In various instances, there can be a capacitance 606, which can correspond to a capacitive interaction that occurs between the ground plane 504 and one of the pads of the planar capacitor of the transmon qubit 508. Moreover, there can be a capacitance 608, which can correspond to a capacitive interaction that occurs between the ground plane 504 and the other of the pads of the planar capacitor of the transmon qubit 508.

In various aspects, as shown, there can be a Josephson junction 610, which can correspond to the Josephson junction of the transmon qubit 512. There can also be a capacitance 612 that is in parallel with the Josephson junction 610, which can correspond to the planar capacitor of the transmon qubit 512 (e.g., the capacitance 612 can shunt the Josephson junction 610). In various cases, there can be a capacitance 614, which can correspond to a capacitive interaction that occurs between the ground plane 504 and one of the pads of the planar capacitor of the transmon qubit 512. Furthermore, there can be a capacitance 616, which can correspond to a capacitive interaction that occurs between the ground plane 504 and the other of the pads of the planar capacitor of the transmon qubit 512.

In various aspects, there can be resonator 618, which can correspond to the $\lambda/4$ resonator 518. In various instances, there can be a capacitance 620, which can correspond to the direct capacitive interaction that arises between a planar capacitor pad of the transmon qubit 508 and the coupler arm 514. Additionally, there can be a capacitance 622, which can correspond to the direct capacitive interaction that arises between the planar capacitor pad of the transmon qubit 508 and the coupler arm 516. Similarly, there can be a capacitance 624 and a capacitance 626. In various cases, the capacitance 624 can correspond to the direct capacitive interaction that occurs between a planar capacitor pad of the transmon qubit 512 and the coupler arm 514, and the capacitance 626 can correspond to the direct capacitive interaction that occurs between a planar capacitor pad of the transmon qubit 512 and the coupler arm 516.

Finally, there can be a parasitic capacitance 628 and a parasitic capacitance 630. In various aspects, the parasitic capacitance 628 can correspond to the cross-capacitive interaction that occurs between the coupler arm 514 and the coupler arm 516 within the qubit pocket 506. Similarly, the parasitic capacitance 630 can correspond to the cross-capacitive interaction that occurs between the coupler arm 514 and the coupler arm 516 within the qubit pocket 510. Just as described above with respect to FIGS. 1-4, the capacitance 620 and/or the capacitance 622 can be controllably tuned so as to compensate for the parasitic capacitance 628 (e.g., the tuning can cause the parasitic capacitance 628 to be less than and/or equal to the lesser of the capacitance 620 and the capacitance 622 while still being within an order of magnitude of the lesser of the capacitance 620 and the capacitance 622). Likewise, the capacitance 624 and/or the capacitance 626 can be controllably tuned so as to compensate for the parasitic capacitance 630 (e.g., the tuning can cause the parasitic capacitance 630 to be less than and/or equal to the lesser of the capacitance 624 and the capacitance 626 while still being within an order of magnitude of the lesser of the capacitance 624 and the capacitance 626).

Referring back to FIG. 5, note that the small physical separation distance between the coupler arm 514 and the coupler arm 516 within the qubit pocket 506 can leave much of the perimeter of the transmon qubit 508 open and/or free. In other words, the small physical separation distance between the coupler arm 514 and the coupler arm 516 can leave much space within the qubit pocket 506 available for other coupler arms of other multi-order filters (not shown) to interface with the transmon qubit 508. Moreover, as described thoroughly herein, although such small physical separation distance can cause the parasitic capacitance 628, the parasitic capacitance 628 can actually not hinder the quantum electrical behavior of the transmon qubit 508 (e.g., the capacitance 620 and/or the capacitance 622 can be tuned so as to compensate for the parasitic capacitance 628). Similarly, note that the small physical separation distance between the coupler arm 514 and the coupler arm 516 within the qubit pocket 510 can leave much of the perimeter of the transmon qubit 512 open and/or free. That is, the small physical separation distance between the coupler arm 514 and the coupler arm 516 can leave much space within the qubit pocket 510 available for other coupler arms of other multi-order filters (not shown) to interface with the transmon qubit 512. Again, as described thoroughly herein, although such small physical separation distance can cause the parasitic capacitance 630, the parasitic capacitance 630 can actually not hinder the quantum electrical behavior of the transmon qubit 512 (e.g., the capacitance 624 and/or the capacitance 626 can be tuned so as to compensate for the parasitic capacitance 630).

Figure 7:
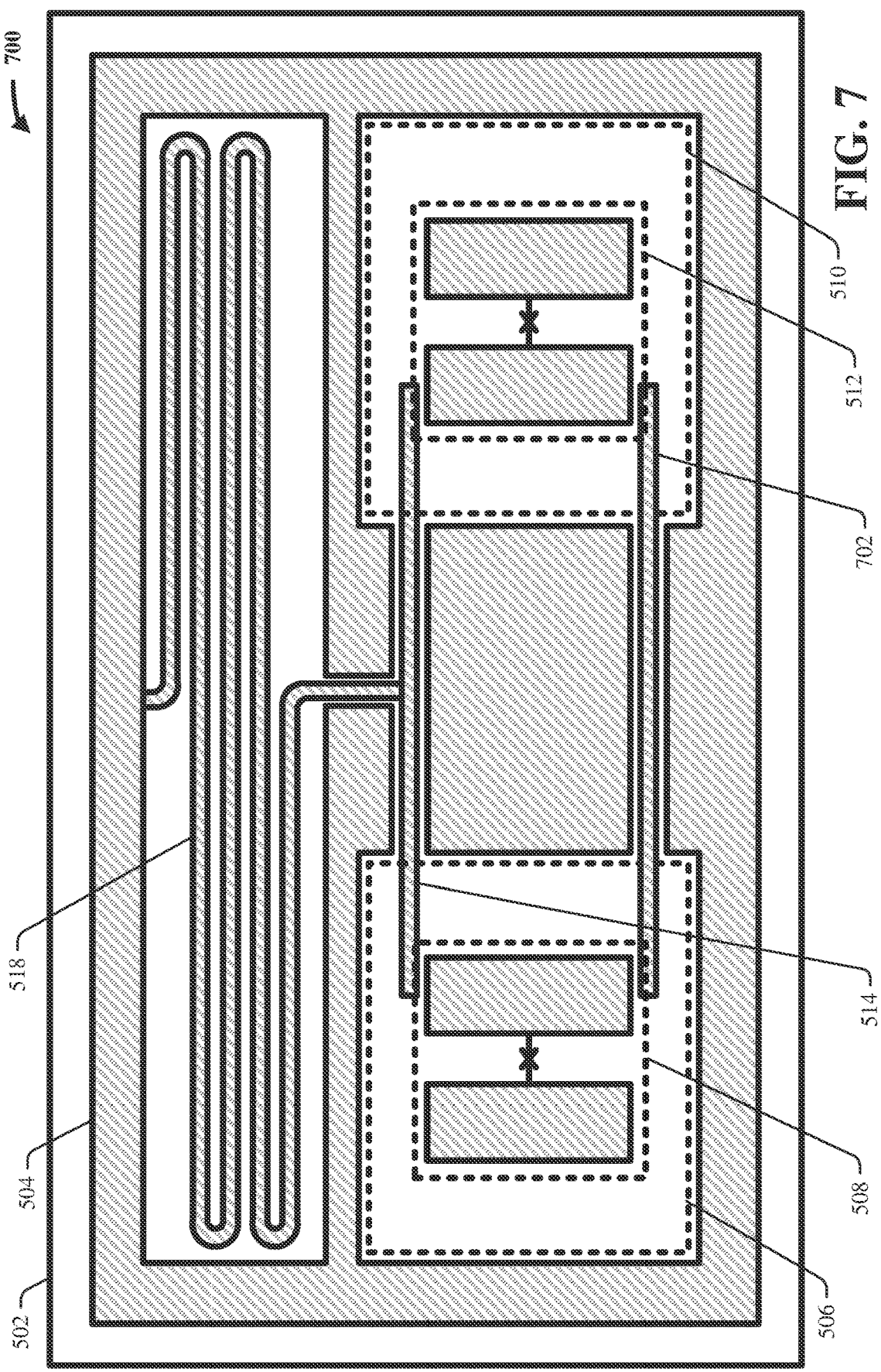
FIG. 7 illustrates a block diagram of a system including a ZZ cancellation coupler that facilitates non-space-saving coupler arm arrangement.
Figure 8:
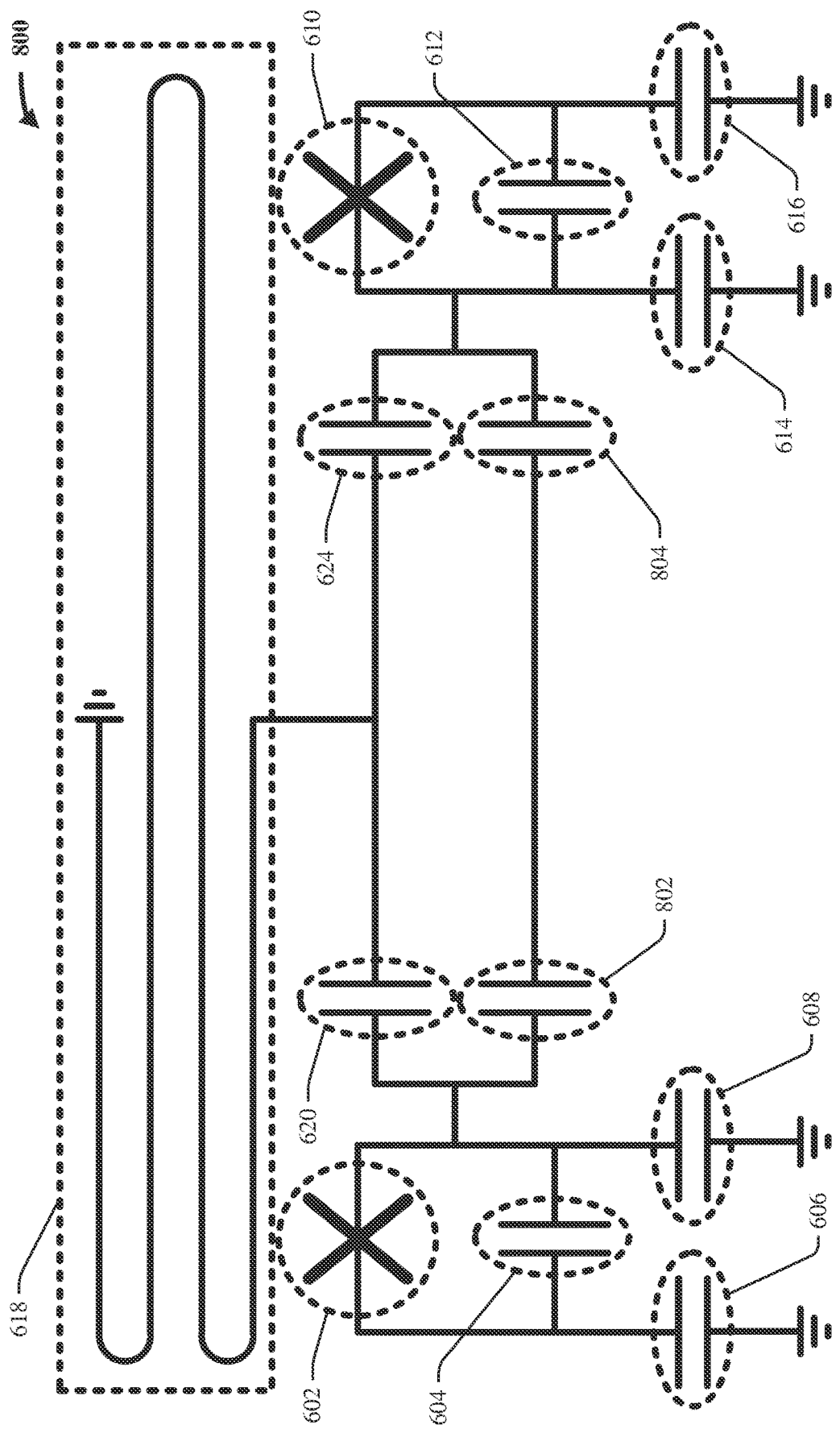
FIG. 8 illustrates a circuit diagram of a system including a ZZ cancellation coupler that facilitates non-space-saving coupler arm arrangement.

Now, consider FIGS. 7-8. FIG. 7 illustrates a block diagram of a system 700 including a ZZ cancellation coupler that facilitates non-space-saving coupler arm arrangement. As shown, the system 700 can, like the system 500, comprise the substrate 502, the ground plane 504, the qubit pocket 506, the transmon qubit 508, the qubit pocket 510, the transmon qubit 512, the coupler arm 514, and the λ/4 resonator 518. However, unlike the system 500, the system 700 can comprise a coupler arm 702 rather than the coupler arm 516.

As shown, the coupler arm 702 can be placed not in physical proximity of the coupler arm 514 within the qubit pocket 506. In other words, the coupler arm 514 and the coupler arm 702 can be spaced far apart within the qubit pocket 506, so as to minimize and/or eliminate any cross-capacitive interaction between the coupler arm 514 and the coupler arm 702 within the qubit pocket 506. Similarly, the coupler arm 702 can be placed not in physical proximity of the coupler arm 514 within the qubit pocket 510. That is, the coupler arm 514 and the coupler arm 702 can be spaced far apart within the qubit pocket 510, so as to minimize and/or eliminate any cross-capacitive interaction between the coupler arm 514 and the coupler arm 702 within the qubit pocket 510. This is shown in FIG. 8.

FIG. 8 illustrates a circuit diagram 800 of a system including a ZZ cancellation coupler that facilitates non-space-saving coupler arm arrangement. In other words, the circuit diagram 800 can be considered as representing various electrical characteristics of the system 700.

As shown, the circuit diagram 800 can, like the circuit diagram 600, include the Josephson junction 602, the capacitance 604, the capacitance 606, the capacitance 608, the Josephson junction 610, the capacitance 612, the capacitance 614, the capacitance 616, the resonator 618, the capacitance 620, and the capacitance 624. However, unlike the circuit diagram 600, the circuit diagram 800 can include a capacitance 802 and a capacitance 804 and can exclude both the parasitic capacitance 628 and the parasitic capacitance 630.

In various aspects, the capacitance 802 can correspond to the direct capacitive interaction that arises between a planar capacitor pad of the transmon qubit 508 and the coupler arm 702. Likewise, the capacitance 804 can correspond to the direct capacitive interaction that arises between the planar capacitor pad of the transmon qubit 512 and the coupler arm 702. As shown, because the coupler arm 514 and the coupler arm 702 can be separated by such a large distance within the qubit pocket 506, there can be no parasitic capacitance the crosses the electrical line hosting the capacitance 620 with the electrical line hosting the capacitance 802. Similarly, because the coupler arm 514 and the coupler arm 702 can be separated by such a large distance within the qubit pocket 510, there can be no parasitic capacitance the crosses the electrical line hosting the capacitance 624 with the electrical line hosting the capacitance 804.

Consider again FIGS. 5 and 7. Both FIGS. 5 and 7 can be considered as depicting a ZZ cancellation coupler that couples the transmon qubit 508 to the transmon qubit 512. More specifically, the coupler arm 514, the coupler arm 516, and the resonator 518 can be collectively considered as the ZZ cancellation coupler of FIG. 5; and the coupler arm 514, the coupler arm 702, and the resonator 518 can be collectively considered as the ZZ cancellation coupler of FIG. 7. As shown in the non-limiting examples of FIGS. 5 and 7, the difference between such multi-order filters can be the separation distances between the coupler arms. In particular, the coupler arms of the multi-order filter of FIG. 5 (e.g., 514 and 516) are physically separated by a small distance within the qubit pockets 506 and 510, which results in non-negligible parasitic capacitances (e.g., 628, 630) between the coupler arms. Because the coupler arms of the multi-order filter of FIG. 5 are so close together in the qubit pockets, the multi-order filter of FIG. 5 can block significantly less of the perimeters of the transmon qubits 508 and 512. In contrast, the coupler arms of the multi-order filter of FIG. 7 (e.g., 514 and 702) are physically separated by a large distance within the qubit pockets, which results in zero and/or negligible parasitic capacitances between the coupler arms. Because the coupler arms of the multi-order filter of FIG. 7 are so far apart in the qubit pockets 506 and 510, the multi-order filter of FIG. 7 can block significantly more of the perimeters of the transmon qubits 508 and 512. In other words, the multi-order filter of FIG. 5 allows many more filters to be coupled to the transmon qubits, whereas the multi-order filter of FIG. 7 does not allow many more filters to be coupled to the transmon qubits.

Moreover, as thoroughly explained above, the present inventors experimentally discovered that the multi-order filter of FIG. 5 can have no negative affect on the quantum electronic performance of the transmon qubits 508 and 512, despite the parasitic capacitances 628 and 630 (e.g., the direct capacitances between the coupler arms and the transmon qubits can be tuned so as to compensate for such parasitic capacitances). Thus, the net result can be that the multi-order filter of FIG. 5 exhibits substantially the same performance as the multi-order filter of FIG. 7, without consuming nearly as much on-chip space as the multi-order filter of FIG. 7. Indeed, such substantially same performance is shown in FIG. 9.

FIG. 9 illustrates example, non-limiting experimental and/or simulation results that demonstrate the efficacy of space-saving coupler arm arrangement for superconducting qubits in accordance with one or more embodiments described herein.

As shown, FIG. 9 depicts a graph 902 and a graph 904. In various aspects, the present inventors simulated the performance of the system 500, and such performance is shown in the graph 902. Similarly, the present inventors simulated the performance of the system 700, and such performance is shown in the graph 904.

For simulations of the system 500, the present inventors utilized the following non-limiting values: the Josephson junction 602 and the Josephson junction 610 were each given an impedance of 50 Ohms; the capacitance 604 and the capacitance 612 were each given a value of 30 femtofarads; the capacitance 606, the capacitance 608, the capacitance 614, and the capacitance 616 were each given a value of 20 femtofarads; the capacitance 620 and the capacitance 624 were each given a value of 8 femtofarads; the capacitance 622 and the capacitance 626 were each given a value of 3.5 femtofarads; the parasitic capacitance 628 and the parasitic capacitance 630 were each given a value of 0.5 femtofarads; the resonator 618 was treated as a coplanar waveguide of length 4400 micrometers; the coupler arm 516 was treated as a coplanar waveguide of length 500 micrometers; and the coupler arm 514 was treated as a coplanar waveguide of length 400 micrometers bisected by the resonator 518. Given such simulation values, the present inventors probed and/or measured the quantum electrical behavior (e.g., J-interaction, ZZ-interaction) of one of the transmon qubits 508 and 512 in the system 500, and such probed/measured behavior is shown in the graph 902.

For simulations of the system 500, the present inventors utilized the following non-limiting values: the Josephson junction 602 and the Josephson junction 610 were each given an impedance of 50 Ohms; the capacitance 604 and the capacitance 612 were each given a value of 30 femtofarads; the capacitance 606, the capacitance 608, the capacitance 614, and the capacitance 616 were each given a value of 20 femtofarads; the capacitance 620 and the capacitance 624 were each given a value of 8 femtofarads; the capacitance 802 and the capacitance 804 were each given a value of 3.44 femtofarads; the resonator 618 was treated as a coplanar waveguide of length 4400 micrometers; the coupler arm 516 was treated as a coplanar waveguide of length 500 micrometers; and the coupler arm 514 was treated as a coplanar waveguide of length 400 micrometers bisected by the resonator 518. Given such simulation values, the present inventors probed and/or measured the quantum electrical behavior (e.g., J-interaction, ZZ-interaction) of one of the transmon qubits 508 and 512 in the system 700, and such probed/measured behavior is shown in the graph 904.

Accordingly, the differences between the simulation of the system 500 and the simulation of the system 700 are: the presence of the parasitic capacitances 628 and 630, the value of the capacitance 622 (e.g., 3.5 femtofarads) versus the value of the capacitance 802 (e.g., 3.44 femtofarads), and the value of the capacitance 626 (e.g., 3.5 femtofarads) versus the value of the capacitance 804 (e.g., 3.44 femtofarads). Despite these differences, as shown, the graph 902 and the graph 904 look substantially identical. In other words, the parasitic capacitances 628 and 630 were successfully compensated for by tuning the lesser of the direct capacitance values between the transmon qubits and the coupler arms (e.g., specifically, by increasing the 3.44 femtofarad direct capacitance values to 3.5 femtofarads). In particular, the parasitic capacitance 628 was successfully accounted for by tuning the capacitance 622 to be higher than the capacitance 802, and the parasitic capacitance 630 was successfully accounted for by tuning the capacitance 626 to be higher than the capacitance 804. Those having ordinary skill in the art will appreciate that these precise tuning values are non-limiting examples. Moreover, those having ordinary skill in the art will further appreciate that such tuning values can uniquely vary based on the given operational context.

In any case, the graph 902 and the graph 904 illustrate that, when various embodiments described herein are implemented, space-saving benefits can be achieved for a multi-order filter without negatively affecting the quantum electrical behaviors of qubits that are coupled to the multi-order filter.

Figure 10:
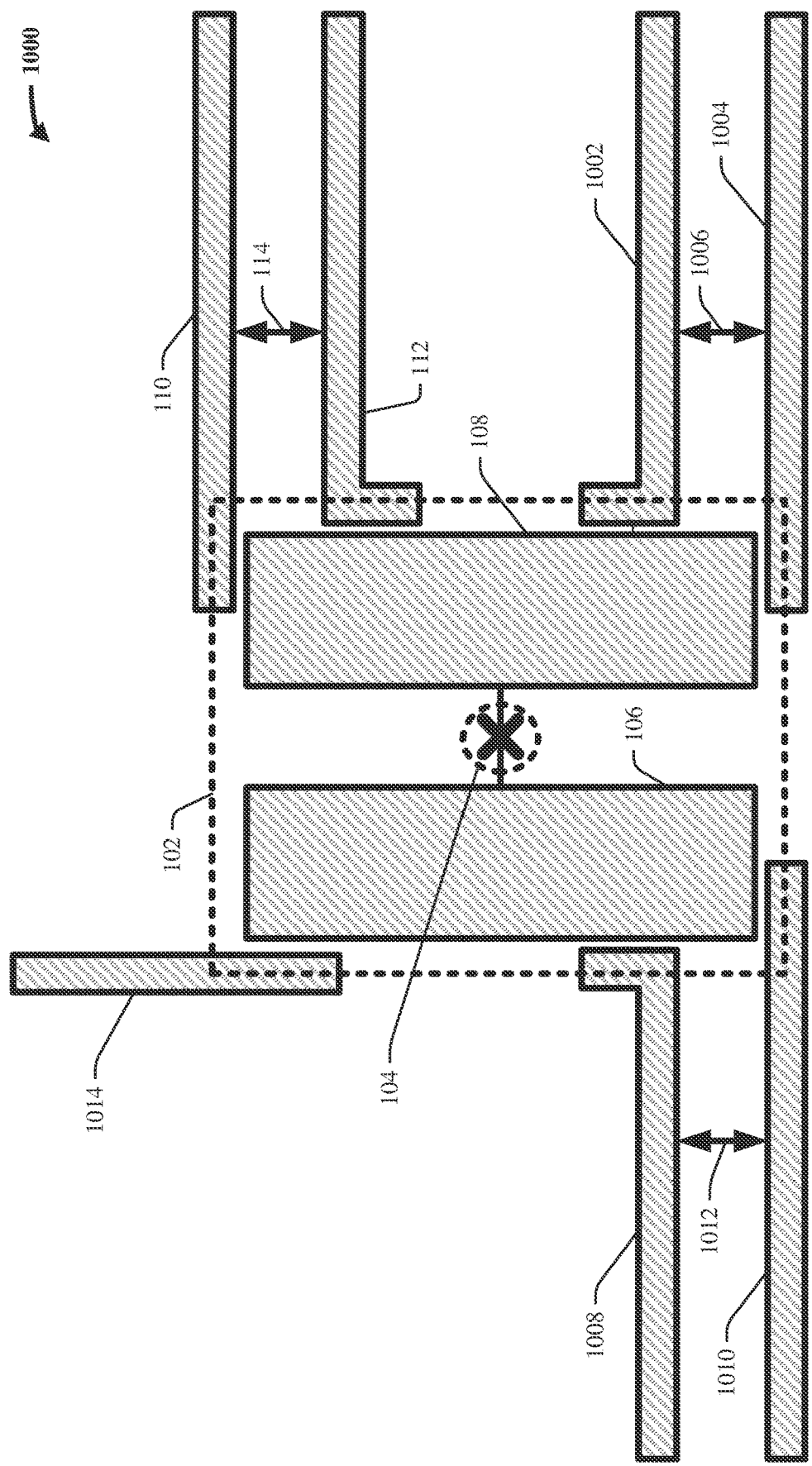
FIGS. 10-11 illustrate block diagrams of example, non-limiting systems including multiple pairs of coupler arms that facilitates space-saving coupler arm arrangement for superconducting qubits in accordance with one or more embodiments described herein.
Figure 11:
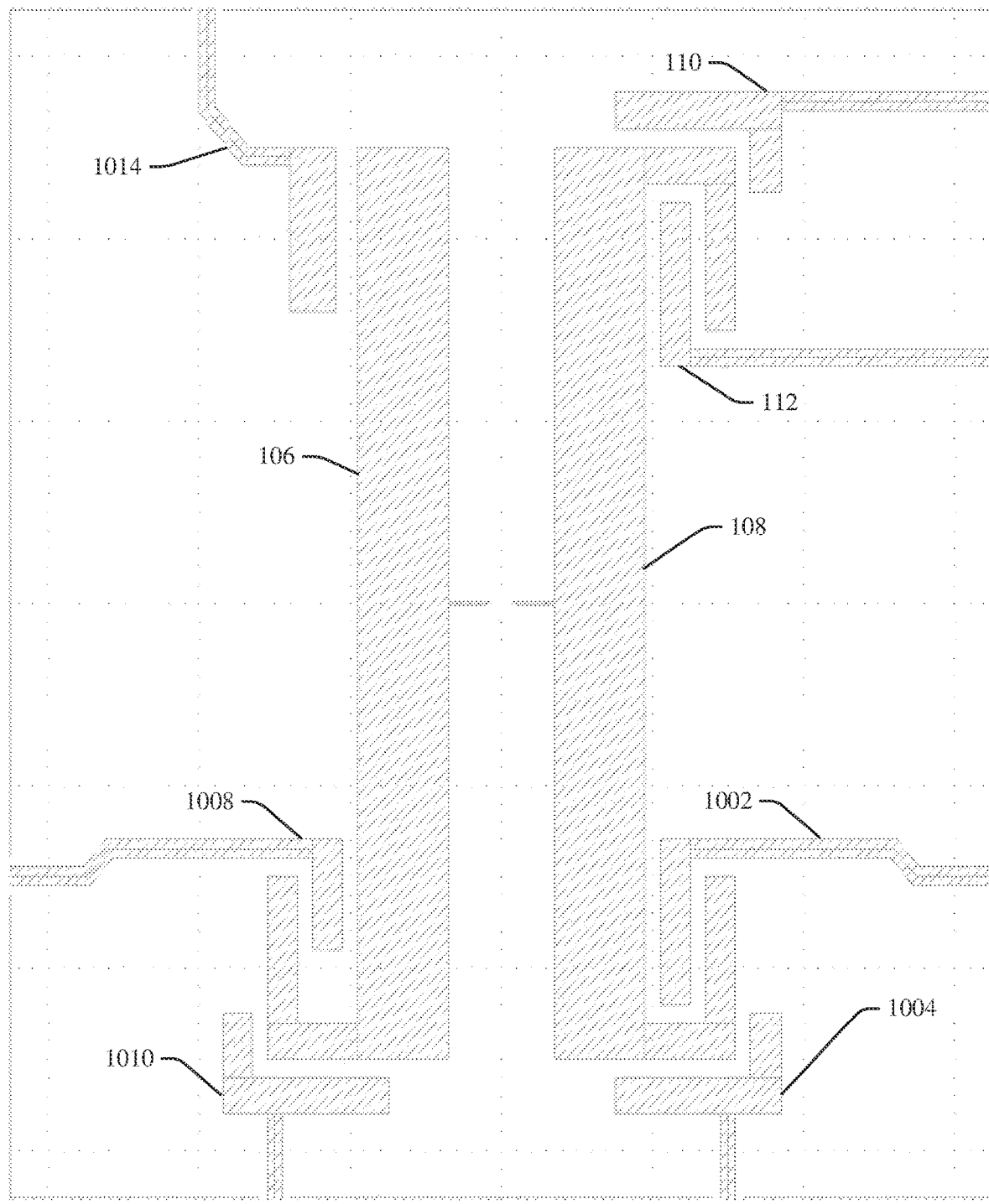

FIGS. 10-11 illustrate block diagrams 1000-1100 of example, non-limiting systems including multiple pairs of coupler arms that can facilitate space-saving coupler arm arrangement for superconducting qubits in accordance with one or more embodiments described herein. In other words, FIGS. 10-11 show why space-saving arrangement of coupler arms can be beneficial.

As shown, FIG. 10 depicts the transmon qubit 102 (comprising the Josephson junction 104 shunted by the planar capacitor pad 106 and the planar capacitor pad 108), the coupler arm 110, the coupler arm 112, and the separation distance 114. As mentioned above, the coupler arm 110 and the coupler arm 112 can belong to a first multi-order filter that couples the transmon qubit 102 to a first other transmon qubit.

As also shown, FIG. 10 depicts a coupler arm 1002 and a coupler arm 1006 that can capacitively interact with the planar capacitor pad 108 and that can be separated by a separation distance 1006, where the separation distance 1006 can equal to and/or otherwise comparable to the separation distance 114. In various cases, the coupler arms 1002 and 1004 can belong to a second multi-order filter that couples the transmon qubit 102 to a second other transmon qubit. Just as explained above with respect to the separation distance 114, the separation distance 1006 can give rise to a parasitic capacitance between the coupler arm 1002 and the coupler arm 1004, where such parasitic capacitance can be comparable to (e.g., of the same order of magnitude as) the direct capacitance between the planar capacitor pad 108 and the coupler arm 1002, and/or where such parasitic capacitance can be comparable to (e.g., of the same order of magnitude as) the direct capacitance between the planar capacitor pad 108 and the coupler arm 1004. As also explained above, the direct capacitance between the planar capacitor pad 108 and the coupler arm 1002 and/or the direct capacitance between the planar capacitor pad 108 and the coupler arm 1004 can be tuned during fabrication to compensate for such parasitic capacitance.

As also shown, FIG. 10 depicts a coupler arm 1008 and a coupler arm 1010 that can capacitively interact with the planar capacitor pad 106 and that can be separated by a separation distance 1012, where the separation distance 1012 can equal to and/or otherwise comparable to the separation distance 114. In various cases, the coupler arms 1008 and 1010 can belong to a third multi-order filter that couples the transmon qubit 102 to a third other transmon qubit. Just as explained above with respect to the separation distance 114, the separation distance 1012 can give rise to a parasitic capacitance between the coupler arm 1008 and the coupler arm 1010, where such parasitic capacitance can be comparable to (e.g., of the same order of magnitude as) the direct capacitance between the planar capacitor pad 106 and the coupler arm 1008, and/or where such parasitic capacitance can be comparable to (e.g., of the same order of magnitude as) the direct capacitance between the planar capacitor pad 106 and the coupler arm 1010. As also explained above, the direct capacitance between the planar capacitor pad 106 and the coupler arm 1008 and/or the direct capacitance between the planar capacitor pad 106 and the coupler arm 1010 can be tuned during fabrication to compensate for such parasitic capacitance.

As also shown, FIG. 10 depicts a coupler arm 1014 that can capacitively interact with the planar capacitor pad 106. In various cases, the coupler arm 1014 can be belong to a readout resonator that corresponds to the transmon qubit 102.

Therefore, as shown in FIG. 10, when small separation distances (e.g., 114, 1006, 1012) are inserted between the coupler arms of a multi-order filter, there can be enough room around the transmon qubit 102 so that multiple multi-order filters (e.g., multiple pairs of coupler arms) can interface with the transmon qubit 102 and so that a readout resonator can be coupled to the transmon qubit 102. If the coupler arms of each multi-order filter were instead separated by a large distance (e.g., 304), then it would be much more difficult, if not impossible, to fit such multiple multi-order filters and a readout resonator around the transmon qubit 102 (e.g., there simply would not be enough available perimeter around the transmon qubit 102). Accordingly, various embodiments described herein, which facilitate space-saving arrangement of coupler arms for superconducting qubits, are certainly beneficial.

Moreover, note that, since the coupler arms 110-112 are separated by the separation distance 114 and since the coupler arms 1002-1004 are separated by the separation distance 1006, the coupler arms 110-112 can be far apart from the coupler arms 1002-1004, which can minimize and/or eliminate next-nearest-neighbor crosstalk between the coupler arms 110-112 and the coupler arms 1002-1004. If the coupler arms 110-112 were instead separated by a large distance (e.g., 304) and if the coupler arms 1002-1004 were also instead separated by a large distance (e.g., 304), then the coupler arms 110-112 would be physically much closer to the coupler arms 1002-1004, which could yield significant next-nearest-neighbor crosstalk between the coupler arms 110-112 and the coupler arms 1002-1004. Accordingly, another benefit of space-saving arrangement of coupler arms for superconducting qubits can be minimization and/or elimination of next-nearest-neighbor crosstalk.

FIG. 11 depicts a non-limiting and example schematic view of the components that are introduced in FIG. 10.

Figure 12:
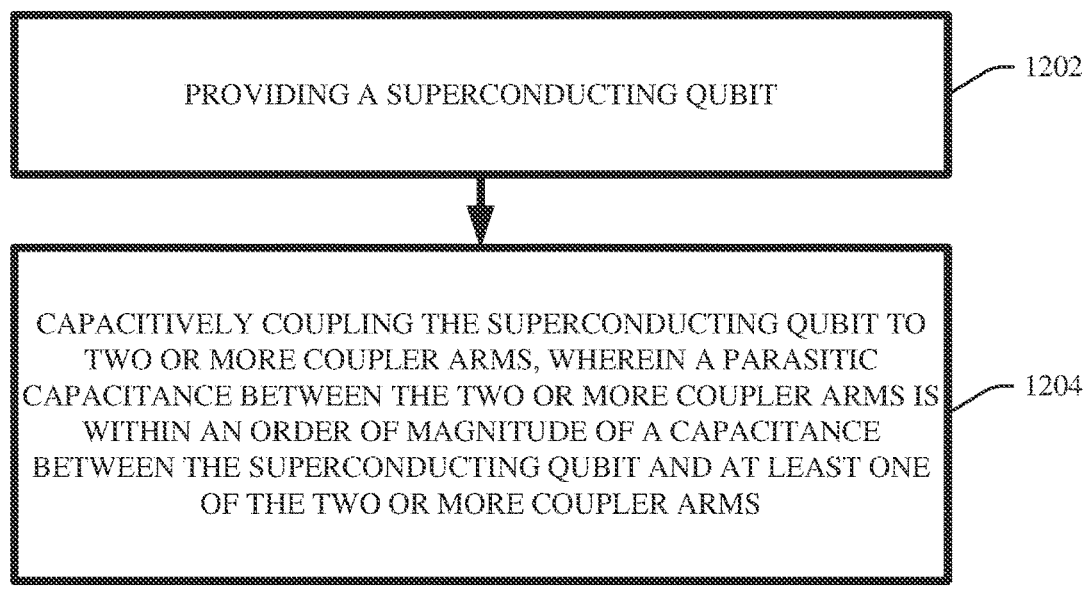
FIG. 12 illustrates a flow diagram of an example, non-limiting method that facilitates space-saving coupler arm arrangement for superconducting qubits in accordance with one or more embodiments described herein.

FIG. 12 illustrates a flow diagram of an example, non-limiting method 1200 that can facilitate space-saving coupler arm arrangement for superconducting qubits in accordance with one or more embodiments described herein.

In various embodiments, act 1202 can include providing (e.g., such as via any suitable microfabrication and/or nanofabrication technique) a superconducting qubit (e.g., 102).

In various aspects, act 1204 can include capacitively coupling (e.g., again, such as via any suitable microfabrication and/or nanofabrication techniques) the superconducting qubit to two or more coupler arms (e.g., 110 and 112). In various cases, a parasitic capacitance (e.g., 208) between the two or more coupler arms can be within an order of magnitude of a capacitance (e.g., 206 and/or 204) between the superconducting qubit and at least one of the two or more coupler arms.

Although not explicitly shown in FIG. 12, the parasitic capacitance can arise due to a physical proximity (e.g., 114) between the two or more coupler arms.

Although not explicitly shown in FIG. 12, the parasitic capacitance can arise within a pocket (e.g., 506) of the superconducting qubit.

Although not explicitly shown in FIG. 12, the superconducting qubit can be a transmon (e.g., as shown in FIG. 1), and the capacitance can exist between a planar capacitor pad (e.g., 108) of the transmon and the at least one of the two or more coupler arms (e.g., 110 and/or 112).

Although not explicitly shown in FIG. 12, the two or more coupler arms can belong to a multi-order filter that couples the superconducting qubit to another superconducting qubit (e.g., as shown in FIG. 5). In some cases, the multi-order filter can be a ZZ cancellation coupler. That is, the multi-order filter can comprise a direct capacitive coupler (e.g., 516) and a $\lambda/4$ resonator coupler (e.g., collectively 514 and 518).

Although not explicitly shown in FIG. 12, the parasitic capacitance can be between 10% of the capacitance and 25% of the capacitance, inclusively.

Although not explicitly shown in FIG. 12, the capacitance can be tuned during fabrication to electrically compensate for the parasitic capacitance.

Although not explicitly shown in a flow diagram, another example, non-limiting method in accordance with various embodiments described herein (e.g., specifically the embodiments with respect to FIGS. 10-11) can include: providing a superconducting qubit (e.g., 102); capacitively coupling a first pair of coupler arms (e.g., 110 and 112) to the superconducting qubit, wherein a first parasitic capacitance (e.g., 208) between the first pair of coupler arms can be within an order of magnitude of a first capacitance (e.g., 204 and/or 206) between the superconducting qubit and at least one of the first pair of coupler arms; and capacitively coupling a second pair of coupler arms (e.g., 1002 and 1004) to the superconducting qubit, wherein a second parasitic capacitance between the second pair of coupler arms can be within an order of magnitude of a second capacitance between the superconducting qubit and at least one of the second pair of coupler arms (e.g., as explained with respect to FIG. 10). In various cases, the first parasitic capacitance can arise due to a first physical spacing (e.g., 114) between the first pair of coupler arms, and the second parasitic capacitance can arise due to a second physical spacing (e.g., 1006) between the second pair of coupler arms. In various aspects, the first parasitic capacitance and the second parasitic capacitance can arise within a pocket of the superconducting qubit. In various instances, the superconducting qubit can be a transmon, the first capacitance can exist between a planar capacitor pad (e.g., 108) of the transmon and the at least one of the first pair of coupler arms, and the second capacitance exists between the planar capacitor pad of the transmon and the at least one of the second pair of coupler arms (e.g., as discussed with respect to FIG. 10). In various cases, the first pair of coupler arms can belong to a first multi-order filter that couples the superconducting qubit to a first other superconducting qubit, and the second pair of coupler arms can belong to a second multi-order filter that couples the superconducting qubit to a second other superconducting qubit (e.g., as explained with respect to FIG. 10). In various aspects, the first parasitic capacitance can be between 10% of the first capacitance and 25% of the first capacitance, inclusively, and the second parasitic capacitance can be between 10% of the second capacitance and 25% of the second capacitance, inclusively. In various instances, the first capacitance can be tuned to electrically compensate for the first parasitic capacitance, and the second capacitance can be tuned to electrically compensate for the second parasitic capacitance.

Accordingly, various embodiments described herein can facilitate space-saving coupler arm arrangement for superconducting qubits. Specifically, such embodiments can facilitate this by inserting small separation distances between the coupler arms of any given multi-order filter, such that there arise non-negligible cross-capacitive interactions between the coupler arms. Such small distances can ensure that the multi-order filter does not block excessive amounts of space around a superconducting qubit. Moreover, one or more direct capacitances between the superconducting qubit and the coupler arms can be controllably tuned so as to provide no net effect on the quantum electrical behavior of the superconducting qubit. Such embodiments can result in multi-order filters that save space without negatively influencing qubits, and thus such embodiments are certainly concrete and tangible technical improvements in the field of qubits.

Although the herein disclosure mainly describes various embodiments of the invention as applying to transmon qubits, this is a mere non-limiting example for ease of explanation. Those having ordinary skill in the art will appreciate that the herein teachings can be applied and/or extrapolated to any suitable types of superconducting qubits.

Although the herein disclosure mainly describes various embodiments of the invention in which a parasitic capacitance is compensated for by increasing the lowest qubit-to-coupler-arm direct capacitance, this is a mere non-limiting example. In various cases, a parasitic capacitance can be compensated for by tuning in any suitable direction (e.g., increasing and/or decreasing) any suitable number of qubit-to-coupler-arm direct capacitances.

Those having ordinary skill in the art will appreciate that the herein disclosure describes non-limiting examples of various embodiments of the subject innovation. For ease of description and/or explanation, various portions of the herein disclosure utilize the term "each" when discussing various embodiments of the subject innovation. Those having ordinary skill in the art will appreciate that such usages of the term "each" are non-limiting examples. In other words, when the herein disclosure provides a description that is applied to "each" of some particular object and/or component, it should be understood that this is a non-limiting example of various embodiments of the subject innovation, and it should be further understood that, in various other embodiments of the subject innovation, it can be the case that such description applies to fewer than "each" of that particular object and/or component.

Figure 13:
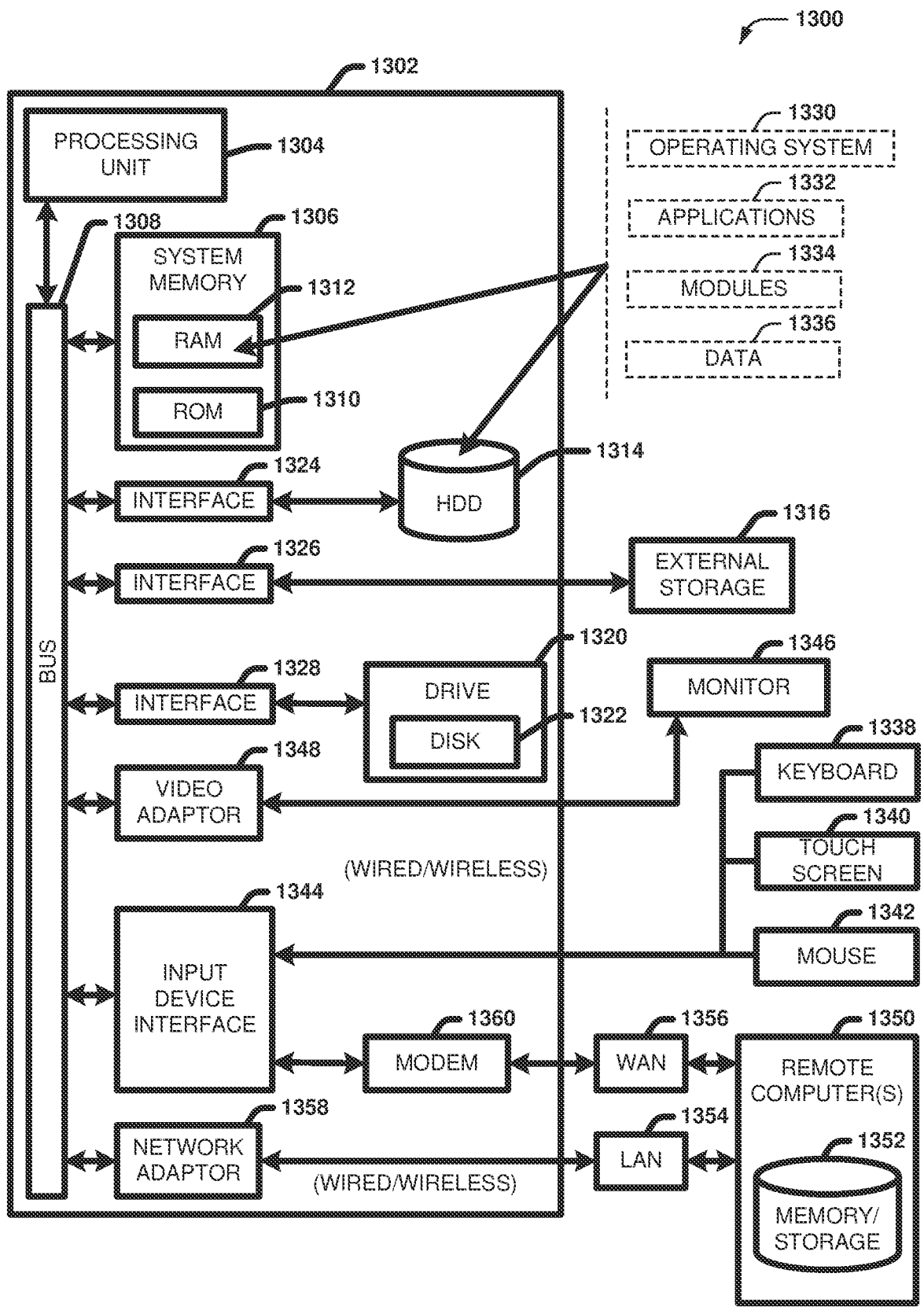
FIG. 13 illustrates a block diagram of an example, non-limiting operating environment in which one or more embodiments described herein can be facilitated.

In order to provide additional context for various embodiments described herein, FIG. 13 and the following discussion are intended to provide a brief, general description of a suitable computing environment 1300 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multi-processor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 13, the example environment 1300 for implementing various embodiments of the aspects described herein includes a computer 1302, the computer 1302 including a processing unit 1304, a system memory 1306 and a system bus 1308. The system bus 1308 couples system components including, but not limited to, the system memory 1306 to the processing unit 1304. The processing unit 1304 can be any of various commercially available processors. Dual microprocessors and other multi-processor architectures can also be employed as the processing unit 1304.

The system bus 1308 can be any of several types of bus structure that can further interconnect to a memory bus (with or without a memory controller), a peripheral bus, and a local bus using any of a variety of commercially available bus architectures. The system memory 1306 includes ROM 1310 and RAM 1312. A basic input/output system (BIOS) can be stored in a non-volatile memory such as ROM, erasable programmable read only memory (EPROM), EEPROM, which BIOS contains the basic routines that help to transfer information between elements within the computer 1302, such as during startup. The RAM 1312 can also include a high-speed RAM such as static RAM for caching data.

The computer 1302 further includes an internal hard disk drive (HDD) 1314 (e.g., EIDE, SATA), one or more external storage devices 1316 (e.g., a magnetic floppy disk drive (FDD) 1316, a memory stick or flash drive reader, a memory card reader, etc.) and a drive 1320, e.g., such as a solid state drive, an optical disk drive, which can read or write from a disk 1322, such as a CD-ROM disc, a DVD, a BD, etc. Alternatively, where a solid state drive is involved, disk 1322 would not be included, unless separate. While the internal HDD 1314 is illustrated as located within the computer 1302, the internal HDD 1314 can also be configured for external use in a suitable chassis (not shown). Additionally, while not shown in environment 1300, a solid state drive (SSD) could be used in addition to, or in place of, an HDD 1314. The HDD 1314, external storage device(s) 1316 and drive 1320 can be connected to the system bus 1308 by an HDD interface 1324, an external storage interface 1326 and a drive interface 1328, respectively. The interface 1324 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1302, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1312, including an operating system 1330, one or more application programs 1332, other program modules 1334 and program data 1336. All or portions of the operating system, applications, modules, and/or data can also be cached in the RAM 1312. The systems and methods described herein can be implemented utilizing various commercially available operating systems or combinations of operating systems.

Computer 1302 can optionally comprise emulation technologies. For example, a hypervisor (not shown) or other intermediary can emulate a hardware environment for operating system 1330, and the emulated hardware can optionally be different from the hardware illustrated in FIG. 13. In such an embodiment, operating system 1330 can comprise one virtual machine (VM) of multiple VMs hosted at computer 1302. Furthermore, operating system 1330 can provide runtime environments, such as the Java runtime environment or the .NET framework, for applications 1332. Runtime environments are consistent execution environments that allow applications 1332 to run on any operating system that includes the runtime environment. Similarly, operating system 1330 can support containers, and applications 1332 can be in the form of containers, which are lightweight, standalone, executable packages of software that include, e.g., code, runtime, system tools, system libraries and settings for an application.

Further, computer 1302 can be enable with a security module, such as a trusted processing module (TPM). For instance with a TPM, boot components hash next in time boot components, and wait for a match of results to secured values, before loading a next boot component. This process can take place at any layer in the code execution stack of computer 1302, e.g., applied at the application execution level or at the operating system (OS) kernel level, thereby enabling security at any level of code execution.

A user can enter commands and information into the computer 1302 through one or more wired/wireless input devices, e.g., a keyboard 1338, a touch screen 1340, and a pointing device, such as a mouse 1342. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1304 through an input device interface 1344 that can be coupled to the system bus 1308, but can be connected by other interfaces, such as a parallel port, an IEEE 1394 serial port, a game port, a USB port, an IR interface, a BLUETOOTH® interface, etc.

A monitor 1346 or other type of display device can be also connected to the system bus 1308 via an interface, such as a video adapter 1348. In addition to the monitor 1346, a computer typically includes other peripheral output devices (not shown), such as speakers, printers, etc.

The computer 1302 can operate in a networked environment using logical connections via wired and/or wireless communications to one or more remote computers, such as a remote computer(s) 1350. The remote computer(s) 1350 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory/storage device 1352 is illustrated. The logical connections depicted include wired/wireless connectivity to a local area network (LAN) 1354 and/or larger networks, e.g., a wide area network (WAN) 1356. Such LAN and WAN networking environments are commonplace in offices and companies, and facilitate enterprise-wide computer networks, such as intranets, all of which can connect to a global communications network, e.g., the Internet.

When used in a LAN networking environment, the computer 1302 can be connected to the local network 1354 through a wired and/or wireless communication network interface or adapter 1358. The adapter 1358 can facilitate wired or wireless communication to the LAN 1354, which can also include a wireless access point (AP) disposed thereon for communicating with the adapter 1358 in a wireless mode.

When used in a WAN networking environment, the computer 1302 can include a modem 1360 or can be connected to a communications server on the WAN 1356 via other means for establishing communications over the WAN 1356, such as by way of the Internet. The modem 1360, which can be internal or external and a wired or wireless device, can be connected to the system bus 1308 via the input device interface 1344. In a networked environment, program modules depicted relative to the computer 1302 or portions thereof, can be stored in the remote memory/storage device 1352. It will be appreciated that the network connections shown are example and other means of establishing a communications link between the computers can be used.

When used in either a LAN or WAN networking environment, the computer 1302 can access cloud storage systems or other network-based storage systems in addition to, or in place of, external storage devices 1316 as described above, such as but not limited to a network virtual machine providing one or more aspects of storage or processing of information. Generally, a connection between the computer 1302 and a cloud storage system can be established over a LAN 1354 or WAN 1356 e.g., by the adapter 1358 or modem 1360, respectively. Upon connecting the computer 1302 to an associated cloud storage system, the external storage interface 1326 can, with the aid of the adapter 1358 and/or modem 1360, manage storage provided by the cloud storage system as it would other types of external storage. For instance, the external storage interface 1326 can be configured to provide access to cloud storage sources as if those sources were physically connected to the computer 1302.

The computer 1302 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

Figure 14:
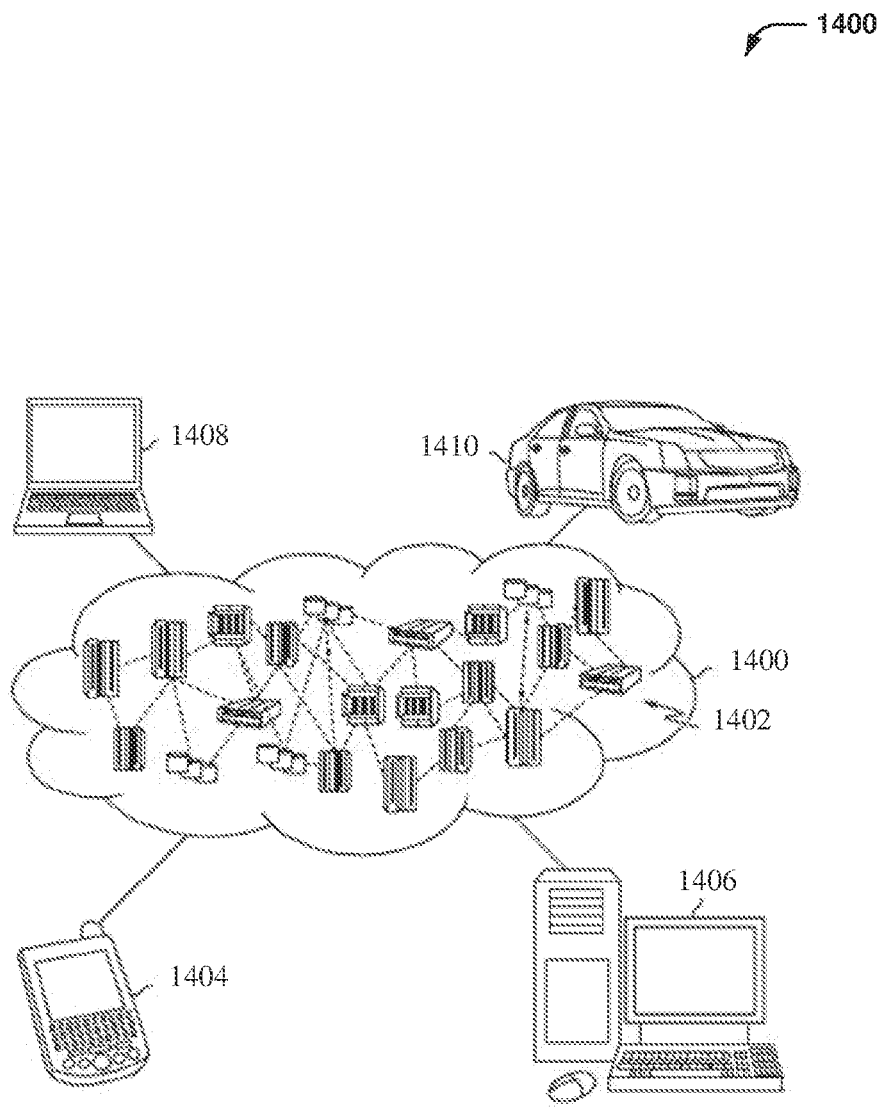
FIG. 14 illustrates an example, non-limiting cloud computing environment in accordance with one or more embodiments described herein.

Referring now to FIG. 14, illustrative cloud computing environment 1400 is depicted. As shown, cloud computing environment 1400 includes one or more cloud computing nodes 1402 with which local computing devices used by cloud consumers, such as, for example, personal digital assistant (PDA) or cellular telephone 1404, desktop computer 1406, laptop computer 1408, and/or automobile computer system 1410 may communicate. Nodes 1402 may communicate with one another. They may be grouped (not shown) physically or virtually, in one or more networks, such as Private, Community, Public, or Hybrid clouds as described hereinabove, or a combination thereof. This allows cloud computing environment 1400 to offer infrastructure, platforms and/or software as services for which a cloud consumer does not need to maintain resources on a local computing device. It is understood that the types of computing devices 1404-1410 shown in FIG. 14 are intended to be illustrative only and that computing nodes 1402 and cloud computing environment 1400 can communicate with any type of computerized device over any type of network and/or network addressable connection (e.g., using a web browser).

Figure 15:
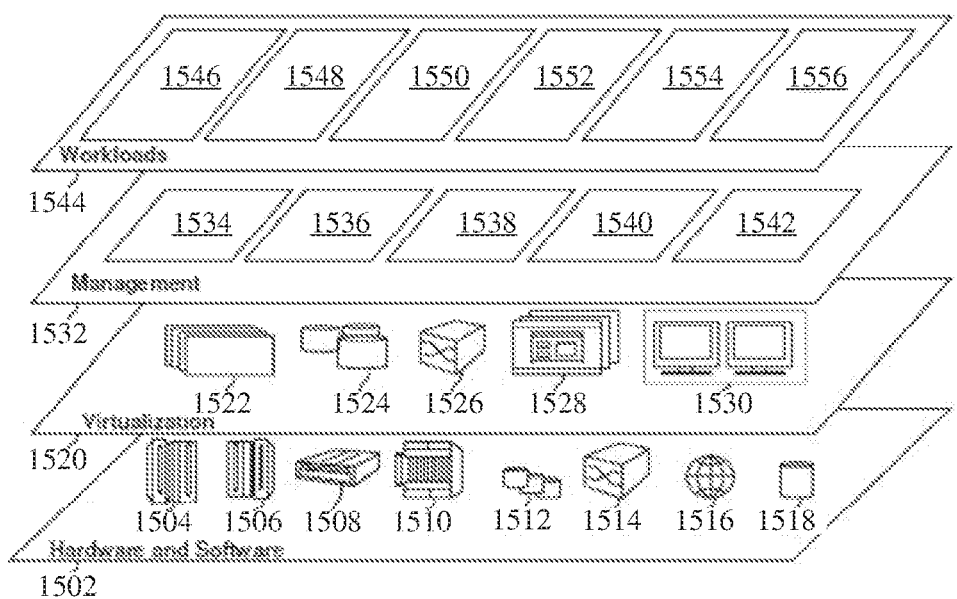
FIG. 15 illustrates example, non-limiting abstraction model layers in accordance with one or more embodiments described herein.

Referring now to FIG. 15, a set of functional abstraction layers provided by cloud computing environment 1400 (FIG. 14) is shown. Repetitive description of like elements employed in other embodiments described herein is omitted for sake of brevity. It should be understood in advance that the components, layers, and functions shown in FIG. 15 are intended to be illustrative only and embodiments of the invention are not limited thereto. As depicted, the following layers and corresponding functions are provided.

Hardware and software layer 1502 includes hardware and software components. Examples of hardware components include: mainframes 1504; RISC (Reduced Instruction Set Computer) architecture based servers 1506; servers 1508; blade servers 1510; storage devices 1512; and networks and networking components 1514. In some embodiments, software components include network application server software 1516 and database software 1518.

Virtualization layer 1520 provides an abstraction layer from which the following examples of virtual entities may be provided: virtual servers 1522; virtual storage 1524; virtual networks 1526, including virtual private networks; virtual applications and operating systems 1528; and virtual clients 1530.

In one example, management layer 1532 may provide the functions described below. Resource provisioning 1534 provides dynamic procurement of computing resources and other resources that are utilized to perform tasks within the cloud computing environment. Metering and Pricing 1536 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1538 provides access to the cloud computing environment for consumers and system administrators. Service level management 1540 provides cloud computing resource allocation and management such that required service levels are met. Service Level Agreement (SLA) planning and fulfillment 1542 provide pre-arrangement for, and procurement of, cloud computing resources for which a future requirement is anticipated in accordance with an SLA.

Workloads layer 1544 provides examples of functionality for which the cloud computing environment may be utilized. Examples of workloads and functions which may be provided from this layer include: mapping and navigation 1546; software development and lifecycle management 1548; virtual classroom education delivery 1550; data analytics processing 1552; transaction processing 1554; and differentially private federated learning processing 1556. Various embodiments of the present invention can utilize the cloud computing environment described with reference to FIGS. 14 and 15 to execute one or more differentially private federated learning process in accordance with various embodiments described herein.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a first superconducting qubit capacitively coupled to a group of coupler arms, wherein a first pair of coupler arms of the group of couplers that are capacitively coupled to a second superconducting qubit are separated by a first defined distance selected to cause a first defined parasitic capacitance between a first coupler arm and a second coupler arm of the first pair of coupler arms that is within a first defined order of magnitude of a first defined capacitance between the first superconducting qubit and a first coupler arm of the first pair of coupler arms, wherein a second defined capacitance between the first superconducting qubit and a second coupler arm of the first pair of coupler arms is greater than the first defined capacitance, and wherein the first defined capacitance is selected to cause the first superconducting qubit to exhibit a defined quantum electrical behavior in response to presence of the first defined parasitic capacitance.

2. The device of claim 1, wherein the defined parasitic capacitance is greater than 10% of the first defined capacitance.

3. The device of claim 1, wherein the parasitic capacitance arises within a qubit pocket of the superconducting qubit, wherein the qubit pocket is located within a ground plane of the device.

4. The device of claim 1, wherein the superconducting qubit is a transmon, and wherein the first defined capacitance exists between a planar capacitor pad of the transmon and the first coupler arm.

5. The device of claim 1, wherein the group of coupler arms further comprises a second pair of coupler arms capacitively coupled to a third superconducting qubit and are separated by a second defined distance, wherein a third defined distance between the first pair of coupler arms and the second pair of couple arms is greater than the first defined distance and the second defined distance.

6. The device of claim 1, further comprising a multi-order filter that comprises the group of coupler arms, a direct capacitive coupler, and a $\lambda/4$ resonator coupler.

7. The device of claim 1, wherein the parasitic capacitance is between 10% of the first defined capacitance and 25% of the first defined capacitance, inclusively.

8. The device of claim 5, wherein the second defined distance is selected to cause a second defined parasitic capacitance between a third coupler arm and a fourth coupler arm of the second pair of coupler arms that is within a second defined order of magnitude of a third defined capacitance between the third superconducting qubit and the third coupler arm, wherein a fourth defined capacitance between the first superconducting qubit and the fourth coupler arm is greater than the third defined capacitance, wherein the third defined capacitance is selected to cause the first superconducting qubit to exhibit the defined quantum electrical behavior in response to presence of the second defined parasitic capacitance capacitance is tuned to electrically compensate for the parasitic capacitance.

9. A system, comprising:
a superconducting qubit capacitively coupled to a group of coupler arms;
wherein a first pair of coupler arms of the group of couplers are separated by a first defined distance selected to cause a first defined parasitic capacitance between a first coupler arm and a second coupler arm of the first pair of coupler arms that is within a first defined order of magnitude of a first defined capacitance between the superconducting qubit and at least one of the first pair of coupler arms, and wherein the first defined capacitance is selected to cause the first superconducting qubit to exhibit a defined quantum electrical behavior in response to presence of the first defined parasitic capacitance; and
wherein a second pair of coupler arms of the group of couplers are separated by a second defined distance selected to cause a second defined parasitic capacitance between a first coupler arm and a second coupler arm of the second pair of coupler arms that is within a second defined order of magnitude of a second defined capacitance between the superconducting qubit and at least one of the second pair of coupler arms, and wherein the second defined capacitance is selected to cause the first superconducting qubit to exhibit the defined quantum electrical behavior in response to presence of the second defined parasitic capacitance.

10. The system of claim 9, wherein the first pair of coupler arms and the second pair of coupler arms are separated by a third defined distance that is greater than the first defined distance and the second defined distance.

11. The system of claim 9, wherein the first defined parasitic capacitance and the second defined parasitic capacitance arise qubit pocket of the superconducting qubit, wherein the qubit pocket is located within a ground plane of a substrate of the system.

12. The system of claim 9, wherein the superconducting qubit is a transmon, wherein the first defined capacitance exists between a planar capacitor pad of the transmon and the at least one of the first pair of coupler arms, and wherein the second defined capacitance exists between the planar capacitor pad of the transmon and the at least one of the second pair of coupler arms.

13. The system of claim 9, wherein the first pair of coupler arms belong to a first multi-order filter that couples the superconducting qubit to a first other superconducting qubit, and wherein the second pair of coupler arms belong to a second multi-order filter that couples the superconducting qubit to a second other superconducting qubit.

14. The system of claim 13, wherein at least one of the first multi-order filter and the second multi-order filter comprises a direct capacitive coupler and a λ/4 resonator coupler.

15. The system of claim 9, wherein the first defined parasitic capacitance is between 10% of the first defined capacitance and 25% of the first defined capacitance, inclusively, and wherein the second defined parasitic capacitance is between 10% of the second defined capacitance and 25% of the second defined capacitance, inclusively.

16. An apparatus, comprising:
  a transmon qubit comprising a Josephson junction shunted by a planar capacitor; and
  a group of coupler arms that are capacitively coupled to a pad of the planar capacitor, wherein a first pair of coupler arms of the group of coupler arms are separated by a first defined distance selected to cause a first defined cross-capacitance between a first coupler arm and a second coupler arm of the first pair of coupler arms that is within a first defined order of magnitude of a first defined capacitance between the pad and at least one of the first coupler arm or second coupler arm, and wherein the first defined capacitance is selected to cause the transmon qubit to exhibit a defined quantum electrical behavior in response to presence of the first defined cross-capacitance capacitance.

17. The apparatus of claim 16, wherein the group of coupler arms belong to a multi-order filter that couples the transmon qubit to another transmon qubit.

18. The apparatus of claim 16, wherein the first defined cross-capacitance is 20% of the first defined capacitance.

19. The apparatus of claim 16, wherein a second pair of coupler arms of the group of coupler arms are separated by a second defined distance selected to cause a second defined cross-capacitance between a first coupler arm and a second coupler arm of the second pair of coupler arms that is within a second defined order of magnitude of a second defined capacitance between the pad and at least one of the first coupler arm or second coupler arm of the second pair of coupler arms, and wherein the second defined capacitance is selected to cause the transmon qubit to exhibit the defined quantum electrical behavior in response to presence of the second defined cross-capacitance capacitance.

20. The apparatus of claim 16, wherein the first pair of coupler arms and the second pair of coupler arms are separated by a third defined distance that is greater than the first defined distance and the second defined distance.

\* \* \* \* \*